United States Patent
Gauri et al.

(10) Patent No.: US 8,809,161 B2
(45) Date of Patent: *Aug. 19, 2014

(54) FLOWABLE FILM DIELECTRIC GAP FILL PROCESS

(71) Applicant: Novellus Systems, Inc., Fremont, CA (US)

(72) Inventors: Vishal Gauri, Fremont, CA (US); Raashina Humayun, Los Altos, CA (US); Chi-I Lang, Sunnyvale, CA (US); Judy H. Huang, Los Gatos, CA (US); Michael Barnes, San Ramon, CA (US); Sunil Shanker, Santa Clara, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/935,398

(22) Filed: Jul. 3, 2013

(65) Prior Publication Data

US 2014/0017904 A1    Jan. 16, 2014

Related U.S. Application Data

(63) Continuation of application No. 12/984,524, filed on Jan. 4, 2011, now Pat. No. 8,481,403, which is a continuation of application No. 12/411,243, filed on Mar. 25, 2009, now Pat. No. 7,888,233, which is a continuation of application No. 11/447,594, filed on Jun. 5, 2006, now Pat. No. 7,524,735, which is a continuation-in-part of application No. 11/323,812, filed on Dec. 29, 2005, now Pat. No. 7,582,555, and a continuation-in-part of application No. 10/810,066, filed on Mar. 25, 2004, now Pat. No. 7,074,690.

(51) Int. Cl.
*H01L 21/4757*    (2006.01)

(52) U.S. Cl.
USPC ..... 438/428; 438/787; 438/788; 257/E21.489

(58) Field of Classification Search
USPC .......................... 438/428, 436; 257/E21.489
See application file for complete search history.

(56) References Cited

U.S. PATENT DOCUMENTS

| | | | |
|---|---|---|---|
| 4,099,990 A | 7/1978 | Brown et al. | |
| 4,740,480 A | 4/1988 | Ooka | |

(Continued)

FOREIGN PATENT DOCUMENTS

| | | | |
|---|---|---|---|
| CN | 1722403 A | 1/2006 | |
| EP | 1 063 692 A1 | 12/2000 | |

(Continued)

OTHER PUBLICATIONS

U.S. Appl. No. 12/984,524, filed Jan. 4, 2011, entitled "Flowable Film Dielectric Gap Fill Process".

(Continued)

*Primary Examiner* — Stephen W Smoot
(74) *Attorney, Agent, or Firm* — Weaver Austin Villeneuve & Sampson LLP

(57) ABSTRACT

Methods of this invention relate to filling gaps on substrates with a solid dielectric material by forming a flowable film in the gap. The flowable film provides consistent, void-free gap fill. The film is then converted to a solid dielectric material. In this manner gaps on the substrate are filled with a solid dielectric material. According to various embodiments, the methods involve reacting a dielectric precursor with an oxidant to form the dielectric material. In certain embodiments, the dielectric precursor condenses and subsequently reacts with the oxidant to form dielectric material. In certain embodiments, vapor phase reactants react to form a condensed flowable film.

27 Claims, 15 Drawing Sheets

(56) References Cited

U.S. PATENT DOCUMENTS

| | | |
|---|---|---|
| 4,923,720 A | 5/1990 | Lee et al. |
| 5,281,274 A | 1/1994 | Yoder |
| 5,320,983 A | 6/1994 | Ouellet |
| 5,387,546 A | 2/1995 | Maeda et al. |
| 5,516,721 A | 5/1996 | Galli et al. |
| 5,525,157 A | 6/1996 | Hawkins et al. |
| 5,534,731 A | 7/1996 | Cheung |
| 5,807,785 A | 9/1998 | Ravi |
| 5,840,631 A | 11/1998 | Kubo et al. |
| 5,858,880 A | 1/1999 | Dobson et al. |
| 5,874,367 A | 2/1999 | Dobson |
| 5,899,751 A | 5/1999 | Chang et al. |
| 5,902,127 A | 5/1999 | Park |
| 5,932,289 A | 8/1999 | Dobson et al. |
| 5,990,013 A | 11/1999 | Berenguer et al. |
| 6,013,581 A | 1/2000 | Wu et al. |
| 6,054,379 A | 4/2000 | Yau et al. |
| 6,060,384 A | 5/2000 | Chen et al. |
| 6,072,227 A | 6/2000 | Yau et al. |
| 6,114,224 A | 9/2000 | Ngo et al. |
| 6,114,259 A | 9/2000 | Sukharev et al. |
| 6,143,626 A | 11/2000 | Yabu et al. |
| 6,207,535 B1 | 3/2001 | Lee et al. |
| 6,218,268 B1 | 4/2001 | Xia et al. |
| 6,242,366 B1 | 6/2001 | Beekman et al. |
| 6,287,989 B1 | 9/2001 | Dobson |
| 6,300,219 B1 | 10/2001 | Doan et al. |
| 6,309,933 B1 | 10/2001 | Li et al. |
| 6,323,123 B1 | 11/2001 | Liu et al. |
| 6,383,951 B1 | 5/2002 | Li |
| 6,399,213 B2 | 6/2002 | Shiokawa |
| 6,413,583 B1 | 7/2002 | Moghadam et al. |
| 6,475,564 B1 | 11/2002 | Carter et al. |
| 6,544,858 B1 | 4/2003 | Beekman et al. |
| 6,635,586 B2 | 10/2003 | Goo et al. |
| 6,640,840 B1 | 11/2003 | MacNeil |
| 6,653,247 B2 | 11/2003 | MacNeil |
| 6,660,663 B1 | 12/2003 | Cheung et al. |
| 6,743,436 B1 | 6/2004 | Lee |
| 6,743,736 B2 | 6/2004 | Mardian et al. |
| 6,787,463 B2 | 9/2004 | Mardian et al. |
| 6,790,737 B2 | 9/2004 | Schneegans et al. |
| 6,812,135 B2 | 11/2004 | Li et al. |
| 6,828,162 B1 | 12/2004 | Halliyal et al. |
| 6,846,757 B2 | 1/2005 | MacNeil |
| 6,858,195 B2 | 2/2005 | Aronowitz et al. |
| 6,902,947 B2 | 6/2005 | Chinn et al. |
| 6,972,262 B2 | 12/2005 | Lee et al. |
| 6,984,561 B2 | 1/2006 | Herner et al. |
| 6,995,056 B2 | 2/2006 | Lee et al. |
| 7,033,945 B2 | 4/2006 | Byun et al. |
| 7,056,560 B2 | 6/2006 | Yim et al. |
| 7,071,126 B2 | 7/2006 | Johnston et al. |
| 7,074,690 B1 | 7/2006 | Gauri et al. |
| 7,074,727 B2 | 7/2006 | Hsu et al. |
| 7,084,505 B2 | 8/2006 | Hamada et al. |
| 7,153,783 B2 | 12/2006 | Lu et al. |
| 7,211,525 B1 | 5/2007 | Shanker et al. |
| 7,238,604 B2 | 7/2007 | Kloster et al. |
| 7,365,000 B2 | 4/2008 | Lee et al. |
| 7,498,273 B2 | 3/2009 | Mallick et al. |
| 7,521,378 B2 | 4/2009 | Fucsko et al. |
| 7,524,735 B1 | 4/2009 | Gauri et al. |
| 7,575,633 B2 | 8/2009 | Romanin |
| 7,582,555 B1 | 9/2009 | Lang et al. |
| 7,585,704 B2 | 9/2009 | Belyansky et al. |
| 7,589,012 B1 | 9/2009 | Seo et al. |
| 7,622,369 B1 | 11/2009 | Lee et al. |
| 7,629,227 B1 | 12/2009 | Wang et al. |
| 7,655,532 B1 | 2/2010 | Chen et al. |
| 7,727,906 B1 | 6/2010 | Shanker et al. |
| 7,794,544 B2 | 9/2010 | Nguyen et al. |
| 7,804,130 B1 | 9/2010 | Fung |
| 7,825,044 B2 | 11/2010 | Mallick et al. |
| 7,888,233 B1 | 2/2011 | Gauri et al. |
| 7,888,273 B1 | 2/2011 | Wang et al. |
| 7,915,139 B1 | 3/2011 | Lang et al. |
| 8,187,951 B1 | 5/2012 | Wang et al. |
| 8,278,224 B1 | 10/2012 | Mui et al. |
| 8,481,403 B1* | 7/2013 | Gauri et al. ............ 438/428 |
| 8,557,712 B1 | 10/2013 | Antonelli et al. |
| 8,580,697 B1 | 11/2013 | Lang et al. |
| 2002/0006729 A1 | 1/2002 | Geiger et al. |
| 2003/0066482 A1 | 4/2003 | Pokharna et al. |
| 2003/0077887 A1 | 4/2003 | Jang et al. |
| 2003/0146416 A1 | 8/2003 | Takei et al. |
| 2003/0159655 A1 | 8/2003 | Lin et al. |
| 2003/0194861 A1 | 10/2003 | Mardian et al. |
| 2003/0210065 A1 | 11/2003 | Lu et al. |
| 2004/0048455 A1 | 3/2004 | Karasawa et al. |
| 2004/0152342 A1 | 8/2004 | Li et al. |
| 2004/0169005 A1 | 9/2004 | Kim et al. |
| 2004/0224496 A1 | 11/2004 | Cui et al. |
| 2005/0026443 A1 | 2/2005 | Goo et al. |
| 2005/0112282 A1 | 5/2005 | Gordon |
| 2005/0136684 A1 | 6/2005 | Mukai et al. |
| 2005/0150453 A1 | 7/2005 | Simmons et al. |
| 2005/0181566 A1 | 8/2005 | Machida et al. |
| 2005/0212179 A1 | 9/2005 | Honda et al. |
| 2005/0260864 A1 | 11/2005 | Huang et al. |
| 2006/0014384 A1 | 1/2006 | Lee et al. |
| 2006/0024912 A1 | 2/2006 | Lee |
| 2006/0216946 A1 | 9/2006 | Usami et al. |
| 2006/0223290 A1 | 10/2006 | Belyansky et al. |
| 2006/0269693 A1 | 11/2006 | Balseanu et al. |
| 2006/0270217 A1 | 11/2006 | Balseanu et al. |
| 2007/0054505 A1 | 3/2007 | Antonelli et al. |
| 2007/0281495 A1 | 12/2007 | Mallick et al. |
| 2007/0298585 A1 | 12/2007 | Lubomirsky et al. |
| 2008/0020591 A1 | 1/2008 | Balseanu et al. |
| 2008/0081434 A1 | 4/2008 | Nam et al. |
| 2008/0132087 A1 | 6/2008 | Xia et al. |
| 2009/0020847 A1 | 1/2009 | Byun et al. |
| 2009/0053895 A1 | 2/2009 | Oshima et al. |
| 2009/0061647 A1 | 3/2009 | Mallick et al. |
| 2009/0104789 A1 | 4/2009 | Mallick et al. |
| 2009/0104790 A1 | 4/2009 | Liang |
| 2009/0298257 A1 | 12/2009 | Lee et al. |
| 2009/0321936 A1 | 12/2009 | Kojima et al. |
| 2010/0109155 A1 | 5/2010 | Liu et al. |
| 2010/0167533 A1 | 7/2010 | Lim et al. |
| 2011/0081782 A1 | 4/2011 | Liang et al. |
| 2011/0151678 A1 | 6/2011 | Ashtiani et al. |
| 2012/0149213 A1 | 6/2012 | Nittala et al. |
| 2012/0161405 A1 | 6/2012 | Mohn et al. |
| 2012/0164328 A1 | 6/2012 | Kojima et al. |
| 2013/0122718 A1 | 5/2013 | Kato et al. |
| 2013/0230987 A1 | 9/2013 | Draeger et al. |

FOREIGN PATENT DOCUMENTS

| | | |
|---|---|---|
| JP | 2001-148382 | 5/2001 |
| JP | 2010-153859 | 7/2010 |
| WO | WO 2007/140376 | 12/2007 |
| WO | WO 2007/140424 | 12/2007 |
| WO | 2011072143 | 6/2011 |

OTHER PUBLICATIONS

U.S. Appl. No. 13/031,077, filed Feb. 18, 2011, entitled "CVD Flowable Gap Fill".
U.S. Appl. No. 13/461,287, filed May 1, 2012, entitled "CVD Flowable Gap Fill".
U.S. Appl. No. 12/986,070, filed Jan. 6, 2011, entitled "Density Gradient-Free Gap Fill".
U.S. Appl. No. 12/334,726, filed Dec. 15, 2008, entitled "PECVD Flowable Dielectric Gap Fill".
U.S. Appl. No. 12/566,085, filed Sep. 24, 2009, enititled "Flowable Oxide Deposition Using Rapid Delivery of Process Gases".
U.S. Appl. No. 13/315,123, filed Dec. 8, 2011, entitled "Premetal Dielectric Integration Process".
U.S. Appl. No. 13/607,511, filed Sep. 7, 2012, entitled "Flowable Oxide Deposition Using Rapid Delivery of Process Gases".

(56) References Cited

OTHER PUBLICATIONS

U.S. Appl. No. 13/493,936, filed Jun. 11, 2012, entitled "Flowable Oxide Film With Tunable Wet Etch Rate".
US Office Action, dated Aug. 23, 2005, issued in U.S. Appl. No. 10/810,066.
US Notice of Allowance and Fee Due, dated Feb. 15, 2006, issued in U.S. Appl. No. 10/810,066.
US Office Action, dated Jun. 27, 2008, issued in U.S. Appl. No. 11/447,594.
US Notice of Allowance and Fee Due, dated Dec. 11, 2008, issued in U.S. Appl. No. 11/447,594.
US Office Action, dated May 24, 2010, issued in U.S. Appl. No. 12/411,243.
US Final Office Action, dated Sep. 13, 2010, issued in U.S. Appl. No. 12/411,243.
US Notice of Allowance, dated Oct. 6, 2010, issued in U.S. Appl. No. 12/411,243.
US Office Action, dated May 18, 2012, issued in U.S. Appl. No. 12/984,524.
US Final Office Action, dated Sep. 14, 2012, issued in U.S. Appl. No. 12/984,524.
US Notice of Allowance, dated Mar. 7, 2013, issued in U.S. Appl. No. 12/984,524.
US Office Action, dated Oct. 26, 2007, issued in U.S. Appl. No. 11/323,812.
US Office Action, dated Apr. 9, 2008, issued in U.S. Appl. No. 11/323,812.
US Office Action, dated Oct. 9, 2008, issued in U.S. Appl. No. 11/323,812.
US Notice of Allowance and Fee Due, dated Apr. 23, 2009, issued in U.S. Appl. No. 11/323,812.
US Notice of Allowance, dated Nov. 18, 2010, issued in U.S. Appl. No. 12/508,461.
US Notice of Allowance, dated Aug. 6, 2012, issued in U.S. Appl. No. 13/031,077.
US Notice of Allowance, dated Jul. 8, 2013, issued in U.S. Appl. No. 13/031,077.
US Office Action, dated Nov. 4, 2008, issued in U.S. Appl. No. 11/925,514.
US Final Office Action, dated Jun. 17, 2009, issued in U.S. Appl. No. 11/925,514.
US Notice of Allowance and Fee Due, dated Jul. 29, 2009, issued in U.S. Appl. No. 11/925,514.
US Office Action, dated Apr. 26, 2011, issued in U.S. Appl. No. 12/625,468.
US Final Office Action, dated Oct. 14, 2011, issued in U.S. Appl. No. 12/625,468.
US Notice of Allowance, dated Jan. 31, 2012, issued in U.S. Appl. No. 12/625,468.
US Office Action, dated Aug. 15, 2013, issued in U.S. Appl. No. 13/461,287.
US Office Action, dated Nov. 12, 2008, issued in U.S. Appl. No. 11/834,581.
US Final Office Action, dated Aug. 6, 2009, issued in U.S. Appl. No. 11/834,581.
US Office Action dated Dec. 18, 2009, issued in U.S. Appl. No. 11/834,581.
US Final Office Action, dated Apr. 22, 2010, issued in U.S. Appl. No. 11/834,581.
US Notice of Allowance, dated Oct. 7, 2010, issued in U.S. Appl. No. 11/834,581.
US Office Action, dated Nov. 25, 2011, issued in U.S. Appl. No. 12/986,070.
US Final Office Action, dated Jun. 25, 2012, issued in U.S. Appl. No. 12/986,070.
US Office Action, dated Feb. 26, 2010, issued in U.S. Appl. No. 12/334,726.
US Final Office Action, dated Oct. 26, 2010, issued in U.S. Appl. No. 12/334,726.
US Office Action, dated Sep. 16, 2011, issued in U.S. Appl. No. 12/334,726.
US Final Office Action, dated Mar. 30, 2012, issued in U.S. Appl. No. 12/334,726.
US Final Office Action, dated Oct. 23, 2012, issued in U.S. Appl. No. 12/334,726.
US Notice of Allowance, dated Jun. 10, 2013, issued in U.S. Appl. No. 12/334,726.
US Notice of Allowance, dated May 29, 2012, issued in U.S. Appl. No. 12/566,085.
US Office Action, dated Jun. 21, 2013, issued in U.S. Appl. No. 13/607,511.
US Office Action, dated Dec. 21, 2012, issued in U.S. Appl. No. 12/964,110.
US Final Office Action, dated Sep. 12, 2013, issued in U.S. Appl. No. 12/964,110.
US Office Action, dated Dec. 6, 2012, issued in U.S. Appl. No. 13/315,123.
US Office Action, dated Jul. 15, 2013, issued in U.S. Appl. No. 13/315,123.
US Office Action, dated Sep. 12, 2013, issued in U.S. Appl. No. 13/493,936.
PCT International Search Report and Written Opinion dated Aug. 10, 2011 issued in PCT/US2010/059721.
Chung, et al. (2004) "Flowable Oxide CVD Process for Shallow Trench Isolation in Silicon Semiconductor," *Journal of Semiconductor Technology and Science*, vol. 4, No. 1, pp. 45-51.
Chung, Sung-Woong, et al. (2002) "Novel Shallow Trench Isolation Process Using Flowable Oxide CVD for sub-100nm DRAM," *IEEE, IEDM*, pp. 233-236.
Hatanaka, M., et al. (1991) "$H_2O$-TEOS Plasma-CVD Realizing Dielectrics Having a Smooth Surface," *IEEE*, VMIC Conference, pp. 435-441.
Matsuura, M., et al. (1994) "Novel Self-Planarizing CVD Oxide for Interlayer Dielectric Applications," *IEEE*, pp. 117-120.
Nakano, M., et al. (1989) "Digital CVD of $SiO_2$," *Extended Abstracts of the 21$^{st}$ Conference on Solid State Devices and Materials*, Tokyo, pp. 49-52.
Noguchi, S. et al. (1987) "Liquid Phase Oxidation Employing O Atoms Produced by Microwave Discharge and $Si(CH_3)_4$," *Extended Abstracts of the 19$^{th}$ Conference on Solid State Devices and Materials*, Tokyo, pp. 451-454.
Sakaue, H., et al. (1990) "Digital Chemical Vapor Deposition of $SiO_2$ Using a Repetitive Reaction of Triethylsilane /Hydrogen and Oxidation," *Department of Electrical Engineering, Hiroshima University*, pp. L 124-L 127.
US Office Action, dated Feb. 28, 2014, issued in U.S. Appl. No. 13/461,287.
US Notice of Allowance, dated Jun. 21, 2012, issued in U.S. Appl. No. 12/566,085.
US Final Office Action, dated Dec. 11, 2013, issued in U.S. Appl. No. 13/607,511.
US Notice of Allowance, dated Dec. 27, 2013, issued in U.S. Appl. No. 12/964,110.
US Notice of Allowance, dated Nov. 8, 2013, issued in U.S. Appl. No. 13/315,123.
US Office Action, dated Nov. 8, 2013, issued in U.S. Appl. No. 13/313,735.
US Final Office Action, dated Feb. 3, 2014, issued in U.S. Appl. No. 13/493,936.
Japanese Office Action dated Sep. 17, 2013 issued in JP2009-282737.
PCT International Preliminary Report on Patentability and Written Opinion dated Jun. 21, 2012 issued in PCT/US2010/059721.
Chinese Office Action dated Feb. 8, 2014 issued in CN 2010-80055670.3.

\* cited by examiner

FLOWABLE FILM DIELECTRIC GAP FILL PROCESS

CROSS-REFERENCE TO RELATED APPLICATIONS

This application is a continuation of and claims priority from U.S. patent application Ser. No. 12/984,524, to be issued as U.S. Pat. No. 8,481,403 on Jul. 9, 2013, filed Jan. 4, 2011, titled "FLOWABLE FILM DIELECTRIC GAP FILL PROCESS," which is a continuation of U.S. application Ser. No. 12/411,243, now U.S. Pat. No. 7,888,233, filed Mar. 25, 2009, titled "FLOWABLE FILM DIELECTRIC GAP FILL PROCESS," which is a continuation of U.S. patent application Ser. No. 11/447,594, now U.S. Pat. No. 7,524,735, filed Jun. 5, 2006, titled "FLOWABLE FILM DIELECTRIC GAP FILL PROCESS," which is a continuation-in-part of U.S. patent application Ser. No. 10/810,066, now U.S. Pat. No. 7,074,690, filed Mar. 25, 2004, titled "SELECTIVE GAP-FILL PROCESS," and which is also a continuation-in-part of U.S. patent application Ser. No. 11/323,812, now U.S. Pat. No. 7,582,555, filed Dec. 29, 2005, titled "CVD FLOWABLE GAP FILL." All of these applications are hereby incorporated in their entireties by this reference.

FIELD OF THE INVENTION

This invention relates to methods for dielectric gap-fill. More specifically, the methods involve provide bottom-up fill of dielectrics by forming a flowable film in the gaps on a substrate.

BACKGROUND

Many deposition processes have difficulty filling the small trenches and other gap features used in current semiconductor processing schemes. Individual trenches and other gap type features produced in any given technology node have principal dimensions that are significantly smaller than the critical dimensions that define the current technology. Thus, it is not unusual to find gaps on the order of 100 nm or less. In future years, these feature sizes will shrink to even smaller dimensions. Unless the processes are extremely conformal, the gaps pinch off at their necks. Compounding the problem is the fact that many of these gaps have relatively high aspect ratios, on the order of at least 6:1. Examples of situations where one can find these dimensions and geometries include damascene copper line processes, shallow trench isolation, and interlayer dielectric (ILD) applications.

Filling such trenches in a reliable manner, while avoiding voids in the fill material is particularly challenging at this scale. Current processes including Physical Vapor Deposition (PVD) and Plasma Enhanced Chemical Vapor Deposition (PECVD), including High Density Plasma Chemical Vapor Deposition (HDP CVD), each of which presents some issues for filling small dimension, high aspect ratio features. Conformal deposition techniques may be inappropriate for situations where the dimension of the neck is narrower than the rest of the feature. This is because the conformal nature of the deposition leads to "pinching off", where the reentrant features are not completely filled before the entrance to the feature is sealed off. In addition, conformal deposition often leads to weak spots or seams in structures with vertical walls.

What is therefore needed is an improved deposition technique for creating void free fill in very narrow dimension features.

SUMMARY

Methods of this invention relate to filling gaps on substrates with a solid dielectric material by forming a flowable film in the gap. The flowable film provides consistent, void-free gap fill. The film is then converted to a solid dielectric material. In this manner gaps on the substrate are filled with the solid dielectric material. According to various embodiments, the methods involve reacting a dielectric precursor with an oxidant to form the dielectric material. In certain embodiments, the dielectric precursor condenses and subsequently reacts with the oxidant to form dielectric material. In other embodiments, vapor phase reactants react to form a condensed flowable film.

One aspect of the invention relates to a method of depositing a solid dielectric material on a substrate having gaps, the method involving the steps of (a) introducing a non-peroxide oxidant reactant and a dielectric precursor reactant into a reaction chamber, such that the reactants are present in the chamber in vapor phase at the same time; (b) forming a flowable film at least in the gaps; and (c) reacting the silicon-containing precursor and the oxidant to form a dielectric material at least in the gaps. In certain embodiments the method further involves (d) converting the flowable film to the solid dielectric material in the gaps. In certain embodiments, the converting the film in (d) occurs in the presence of the oxidant introduced in (a). In certain embodiments (a) through (d) are repeated at least once to build up a film of a desired thickness.

In certain embodiments, the reactants react to form a condensed flowable film on the substrate. This film flows into the gap to fill the gap with the dielectric material. The film is then converted to a solid dielectric material by one or more of various techniques including a thermal anneal, ultraviolet (UV) exposure, microwave exposure, or exposure to an oxidizing plasma. According to certain embodiments, the film is converted to the solid material by mechanisms including (but not limited to) cross-linking the precursor to produce the solid material and/or removal of hydrogen (—H), hydroxyl (—OH) or water ($H_2O$) groups. In a particular embodiment, an inductively-coupled plasma is used to convert the film.

According to various embodiments, the dielectric material is a silicon oxide, e.g., a doped silicon oxide containing boron and/or phosphorus. The precursor of the dielectric material may include one of more of the following compounds triethoxysilane (TES), tetraethylorthosilane (TEOS), tetramethoxysilane (TMOS), methyl triethoxysilane (MTEOS), methyltrimethoxysilane (MTMOS), dimethyldimethoxysilane (DMDMOS), trimethylmethoxysilane (TMMOS), dimethyldiethoxysilane (DMDEOS), bis-triethoxysilylethane (BTEOSE) or bis-triethoxysilylmethane (BTEOSM), tetramethylcyclotetrasiloxane (TMCTS), octamethylcyclotetrasiloxane (OMCTS), and tetravinyltetramethylcyclotetrasiloxane (TVTMCTS). In certain embodiments, the dielectric precursor is mixed in a carrier solvent, e.g., an alcohol.

According to various embodiments, the oxidant may be any suitable oxidant including water/steam, oxygen, ozone or peroxide. In particular embodiments, the oxidant in non-peroxide oxidant, e.g., water/steam, oxygen or ozone.

In certain embodiments, the forming the flowable film involves selectively condensing the dielectric precursor in the gaps. The precursor may be selectively condensed due to the Kelvin effect. The oxidant then reacts with the condensed precursor. In certain embodiments, the oxidant reactant is in the vapor phase when reacted. In certain embodiments, reacting the liquid regions of the precursor with the oxidant converts the film to a solid dielectric material.

Another aspect of the invention relates to a method of depositing a solid dielectric material on a substrate having gaps of dimension on the order of about 100 nanometers or less. The method involves the operations of (a) simultaneously introducing a silica-forming precursor and a second reactive material into a reaction chamber; (b) exposing the substrate to the precursor of the solid dielectric material, which is in the vapor phase in order to achieve selective condensation in narrow gaps where the precursor is liquefied due to the Kelvin effect; and (c) reacting the precursor liquid regions with the second reactive material to form a dielectric material in the gaps. The second reactive material may be an oxidant, e.g., water or steam.

These and other features and advantages of the invention will be described in more detail below with reference to the associated drawings.

DETAILED DESCRIPTION

The present invention relates to deposition processes that provide complete gap of fill high aspect ratio (typically at least 3:1), narrow width gaps. Most deposition methods either deposit more material on the upper region than on the lower region of a sidewall or form cusps (also called top-hats) at the entry of the gap. To remove sidewall and top-hat deposits and keep the gap open for further deposition, conventional HDP CVD processes typically use a multi-cycle deposition process—etch process. Each cycle includes a deposition step followed by an etch step Typically, fluorine species are used in the etch step. These fluorine etch steps are costly and time-consuming, in some cases requiring multiple reactors.

Figure 1:
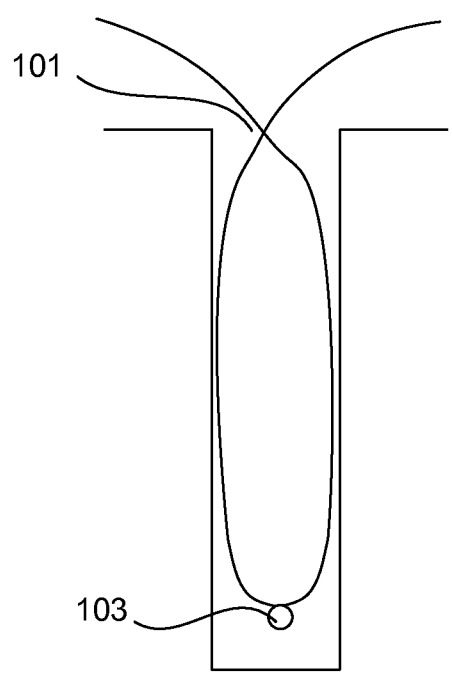
FIG. 1 is a rough schematic cross-sectional diagram of a trench partially filled by a conventional method.

FIG. 1 shows a rough schematic of a trench partially filled by a conventional HDP CVD method. Reference number 101 indicates where sidewalls have formed from film that has been sputtered away from the bottom of the trench and redeposited on the sidewalls of the trench. These sidewalls have pinched off preventing further deposition. A chemical etch is required to re-open the trench before dielectric film can be deposited in it. Multiple deposition-etch-deposition cycles are necessary to fill high aspect ratio trenches or other features. Reference number 103 indicates a weak spot. Conventional gap fill methods often lead to the formation of weak spots in the dielectric film. Weak spots may form as a result of the increased gap volume to gap access area as the gap closes off, and can lead to voids or seams in the gap and ultimately device failure. Other known methods of gap-fill also rely on multi-cycle deposition methods and are susceptible to pinch-off at the top of the gap, and void and seam formation in the gap.

The present invention provides gap-fill methods that result in good, seamless and void-free gap fill. The methods involve depositing a soft jelly-like liquid or flowable film in the gap and then converting the flowable film into a solid dielectric film. The methods of the present invention reduce or eliminate the need for etch steps. In certain embodiments, a single cycle may be performed to fill a gap. In other embodiments, a multi-cycle process may be used to fill a gap.

Figure 2:
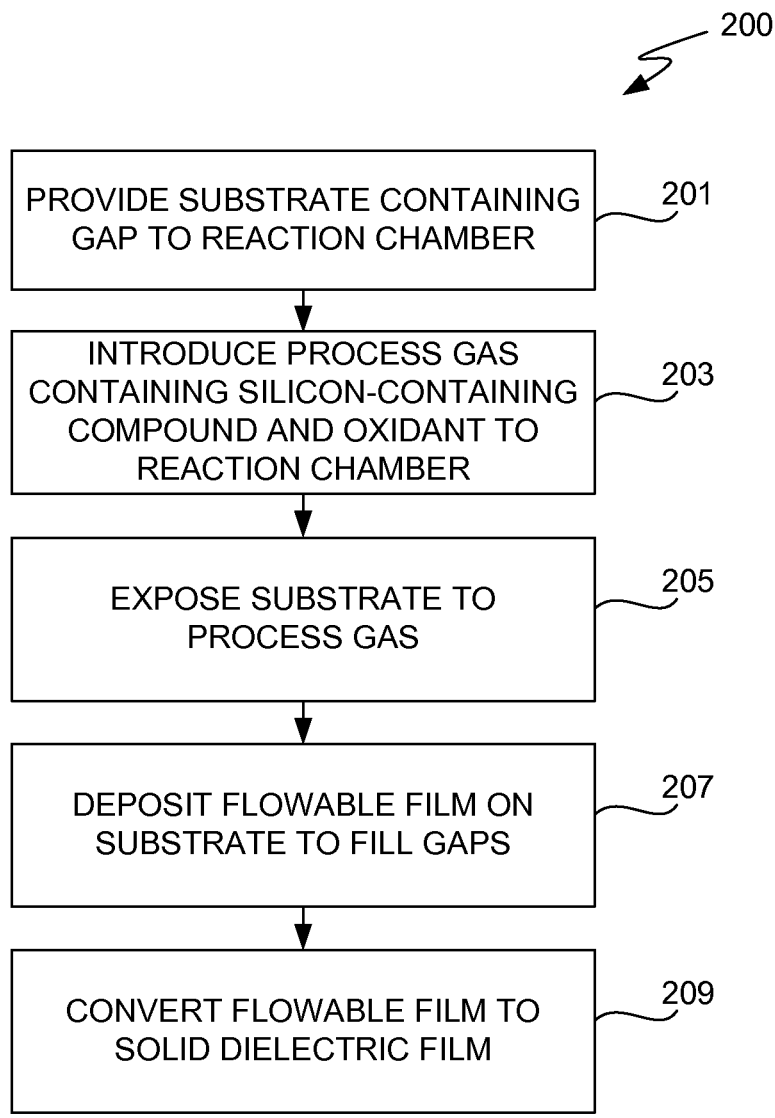
FIG. 2 is a process flow diagram depicting a method according to one embodiment of the invention.

Certain embodiments of the invention involve reacting a dielectric (e.g., a silicon-containing) precursor with an oxidant. The reactants are typically in the vapor phase and react to form a condensed flowable film. FIG. 2 is a process flow sheet depicting a method an example of this embodiment. As shown, a deposition process 200 begins at operation 201 in which a substrate containing a gap is provided to a reaction chamber. Providing the substrate to the reactor may involve clamping the substrate to a pedestal or other support in the chamber. For this purpose, an electrostatic or mechanical chuck may be employed.

After the substrate is provided to the reaction chamber, a process gas is introduced at operation 203. The process gas includes a silicon-containing compound and an oxidant. The gas may also include one or more dopant precursors. Sometimes, though not necessarily, an inert carrier gas is present. In certain embodiments, the gases are introduced using a liquid injection system. Typically the silicon-containing compound and the oxidant are introduced via separate inlets. In certain embodiments the oxidant is doped with a compound that contributes to reducing the reaction rate at the wafer surface. Examples of dopant compounds that reduce the reaction rate include alcohols, e.g., ethanol and isopropyl alcohol. Reducing the reaction rate at the wafer surface may be desirable to facilitate continuous film propagation and growth. Also, in certain embodiments, the reactants may be provided in manner that increases residence time over the wafer surface. For example, in some embodiments, an inert gas (e.g., He, Ar or $N_2$) ballast is provided to increase reactant utilization. The ballast is provided below a baffle plate assembly. This constricts the flow of reactants thereby increasing their resident time over the wafer substrate. Dopant compounds such as boron or phosphorous-containing compounds may also be used to deposit doped oxide dielectric films.

The substrate is then exposed to the process gas at operation 205. Conditions in the reactor are such that the silicon-containing compound and the oxidant react and condense. As shown in operation 207, a flowable film is thereby deposited on the substrate surface. The substrate is exposed to the process gas for a period sufficient to deposit a flowable film to fill the gap. The deposition process typically forms soft jelly-like film with good flow characteristics, providing consistent fill. The deposited film may also be described herein for the purposes of discussion as a gel having liquid flow characteristics, a liquid film or a flowable film.

Process conditions in the reactor are such that the reaction product is a condensed material that is deposited on the surface. In many embodiments, this involves bringing the substrate into the chamber under "dark", i.e., non-plasma conditions. The substrate is not exposed to a plasma during the deposition phase (steps 205 and 207) of the process. Although not indicated on the flow sheet, gaseous byproducts may be continuously pumped from the reaction chamber.

After the flowable film has been deposited in the gap, the as-deposited flowable film is converted to a silicon oxide dielectric film in operation 209. In some embodiments, the film is converted by exposure to a plasma containing, for example, one or more of oxygen, helium, argon and water.

The process gas contains a silicon-containing compound and an oxidant. Suitable silicon-containing compounds include organo-silanes and organo-siloxanes. In certain embodiments, the silicon-containing compound is a commonly available liquid phase silicon source. In some embodiments, a silicon-containing compound having one or more mono, di, or tri-ethoxy, methoxy or butoxy functional groups is used. Examples include, but are not limited to, TOMCAT, OMCAT, TEOS, tri-ethoxy silane (TES), TMS, MTEOS, TMOS, MTMOS, DMDMOS Diethoxy silane(DES), triphenylethoxysilane, 1-(triethoxysilyl)-2-(diethoxymethylsilyl) ethane, tri-t-butoxylsilanol and tetramethoxy silane. Examples of suitable oxidants include ozone, oxygen, hydrogen peroxide and water.

In some embodiments, the silicon-containing compound and the oxidant are delivered to the reaction chamber via liquid injection system that vaporizes the liquid for introduction to the chamber. The reactants are typically delivered separately to the chamber. Typical flow rates of the liquid introduced into a liquid injection system range from 0.1-5.0 mL/min per reactant. Of course, one of skill in the art will understand that optimal flow rates depend on the particular reactants, desired deposition rate, reaction rate and other process conditions.

Acceptable silicon-containing compound/oxidant flow ratios are very variable, as there is typically only a single reaction. Examples of suitable ratios include 3:1-1:100.

The flowable film deposited on the substrate typically contains some combination of Si—O, Si—H and Si—OH bonds. As discussed above, in many embodiments, the reaction of the silicon-containing compound and the oxidant takes place in non-plasma conditions. The absence of RF power (or other plasma source) prevents the incorporation of organic groups in the film. For example, in reaction between TES and steam, the chemical reaction causes formation of a flowable film containing Si—OH, Si—H and Si—O bonds, while the ethoxy group is removed as a gaseous ethanol byproduct. As discussed above with respect to FIG. 1, the byproduct is continuously pumped out.

As indicated above, in certain embodiments a chemical reagent that acts as an inhibitor to slow down the reaction between the silicon and oxidant precursors is used. Examples of such reagents include alcohols such as ethanol, isopropyl alcohol, etc. Ethanol is a by-product of the original chemical reaction as shown in the equation below between the silicon-containing precursor H—Si—(O—C$_2$H$_5$)$_3$ and the oxidant H$_2$O:

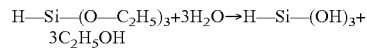

While not being bound by any particular theory, it is believed that the providing ethanol along with the oxidant precursor causes the reaction to be slowed down due to only two of the ethoxy groups on the silicon-containing precursor being converted. It is believed that the remaining ethoxy groups serves to network the film by acting as a link. Depicted below is one embodiment of this method using a 25-90% molar solution of ethanol:

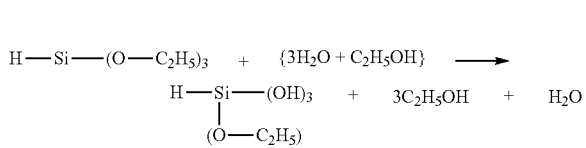

Film composition depends in part on the oxidant chosen, with a weaker oxidant (e.g., water) resulting in more Si—H bonds than a stronger oxidant (e.g., ozone). Using ozone will result in conversion of most of the Si—H bonds to Si—OH bonds. An exemplary reaction according to one embodiment of the invention between an organo-silane precursor (R$_{4-x}$—SiH$_x$) and peroxide (H$_2$O$_2$) produces a silanol gel (R—Si(OH)$_x$ as well as other byproducts that may be pumped out.

Reactions conditions are such that the silicon-containing compound and oxidant, undergo a condensation reaction, condensing on the substrate surface to form a flowable film.

As discussed above, the reaction typically takes place in dark or non-plasma conditions. Chamber pressure may be between about 1-100 Torr, in certain embodiments, it is between 5 and 20 Torr, or 10 and 20 Torr. In a particular embodiment, chamber pressure is about 10 Torr.

Substrate temperature is typically between about −20 and 100 C. In certain embodiments, temperature is between about 0 and 35 C. Pressure and temperature may be varied to adjust deposition time; high pressure and low temperature are generally favorable for quick deposition. High temperature and low pressure will result in slower deposition time. Thus, increasing temperature may require increased pressure. In one embodiment, the temperature is about 5 C and the pressure about 10 Torr.

Exposure time depends on reaction conditions as well as the desired film thickness. Deposition rates are typically from about 100 angstroms/min to 1 micrometer/min.

Showerhead (or other gas inlet) to pedestal distance should also be small to facilitate deposition. Showerhead-pedestal distance is typically ranges from about 300 mil-5 inches. In some embodiments, it ranges from about 300 mil-1 inch.

Figure 11:
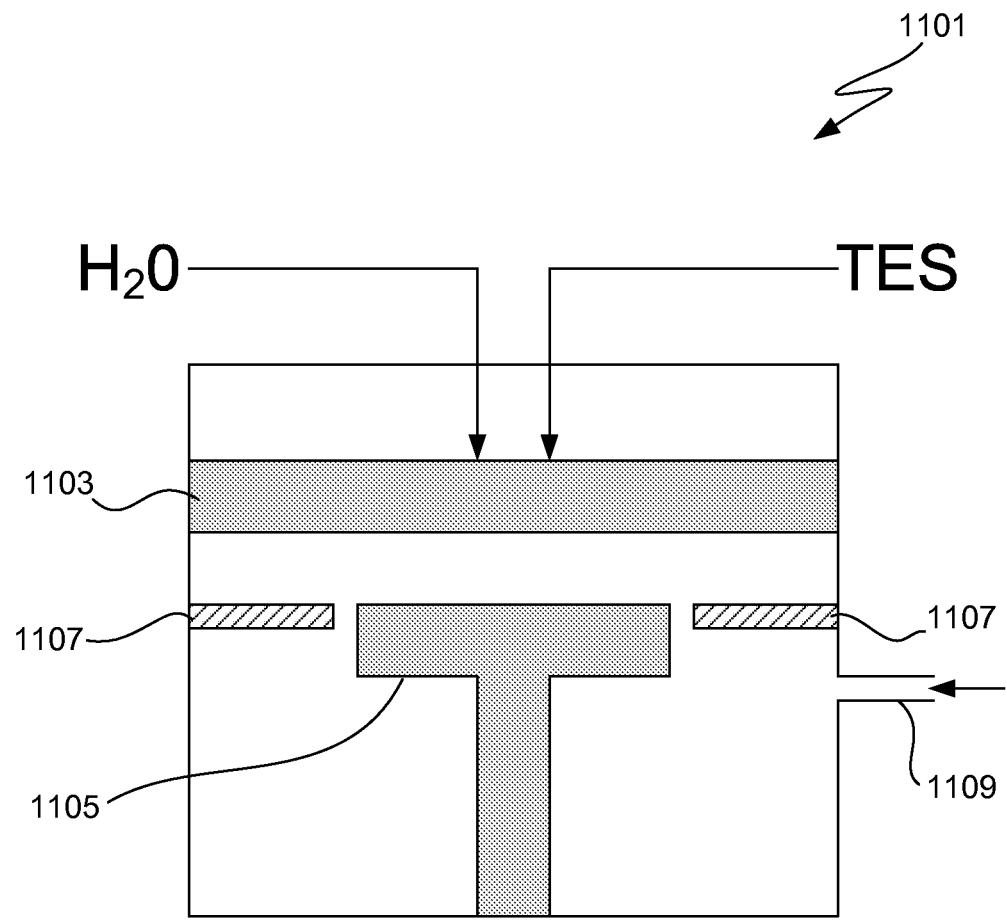
FIG. 11 shows an embodiment of the reaction chamber utilizing a baffle plate assembly to increase precursor utilization.

A baffle plate assembly is utilized in certain embodiments to constrict reactant flow, thereby increasing the residence time of the silicon and oxidant precursors above the wafer substrate. The baffle plate assembly is mechanically attached to the chamber body and tends to be at the same temperature of the chamber walls (i.e., >30 C) to prevent deposition from occurring on the baffle plates. The change in conductance is achieved by providing an inert gas ballast below the baffle plates. Examples of inert gases that may be used include He, Ar and N$_2$. Typical flow rates for the ballast vary from 100 sccm to 5 slm for the inert gases. In one embodiment a flow of 2 slm of He is used to create a ballast. A schematic of a deposition using baffle is depicted in FIG. 11 and discussed further below.

After the flowable film is deposited on the substrate, it is converted to a solid silicon dioxide film. In certain embodiments, this conversion may involve removal of hydrogen (—H), hydroxyl (—OH) or water ($H_2O$) groups to produce the solid material. The removal of hydrogen (—H), hydroxyl (—OH) or water ($H_2O$) groups may occur by thermal anneal, ultraviolet (UV) exposure, microwave exposure, or exposure to an oxidizing plasma.

According to various embodiments, the film may be converted to a solid oxide film by exposure to a plasma. This results in a top-down conversion of the flowable film to a solid film. Oxygen, helium, argon and steam plasmas are examples of plasmas that may be used. The plasma may also contain one or more of these compounds. Nitrogen-containing plasmas should be avoided if the incorporation of nitrogen in the resulting dielectric film is undesirable. Temperatures during plasma exposure are typically about 200 C or higher.

In certain embodiments, an oxygen or oxidizing plasma is used to facilitate conversion of the Si—H bonds into Si—O bonds. An oxygen-containing plasma may be particularly useful for flowable films that have a high number of Si—H bonds, e.g., for films formed by the reaction of TEOS and steam.

Pressure is typically low, e.g., less than about 6 Torr. In certain embodiments, ultra-low pressures, on the order of about 0-10 mTorr are used during the conversion step. Using low pressure allows top-down conversion of the flowable film without leaving voids in the film. Without being bound by a particular theory, it is believed that low pressure causes sites left vacant by the removal of —H and —OH groups to be filled only by available oxygen radicals in the plasma.

Also in certain embodiments, inductively coupled (high density) plasmas are used to facilitate conversion. Si—OH sites may be converted to Si—O sites by thermal excitation. Use of an inductively coupled plasma provides a thermal environment that facilitates conversion of the Si—OH sites to Si—O sites as well as the oxygen ions and radicals that are able to react with the Si—H sites to convert them to Si—OH sites (which may then converted to Si—O sites by elevated temperature or other excitation).

The plasma source may be any known plasma source, including RF and microwave sources. In a RF plasma, plasma power is typically at least about 3000 W. Also the plasma-assisted conversion is preferably performed with a high frequency substrate bias.

In some embodiments, a thermal anneal may be used instead of or in addition to a plasma to convert the film into a solid oxide. Thermal annealing may be performed in any suitable ambient, such as a water, oxygen or nitrogen ambient. Temperatures are typically at least about 250 C, i.e. high enough to break the Si—OH bond. For example, thermally annealing a silanol gel R—Si(OH)$_x$ results in a silicon dioxide $SiO_2$ film and water vapor. In some embodiments, microwave or UV curing may also be used.

Also in some embodiments, an oxidizing environment to convert Si—H sites to Si—OH sites may be obtained by utilizing thermal, UV, microwave or plasma curing in the presence of one or more oxidants such as oxygen, ozone, steam, etc. In certain embodiments, providing an oxidizing environment in operation 209 may involve using the same oxidant flow as in operation 203.

Figure 3:
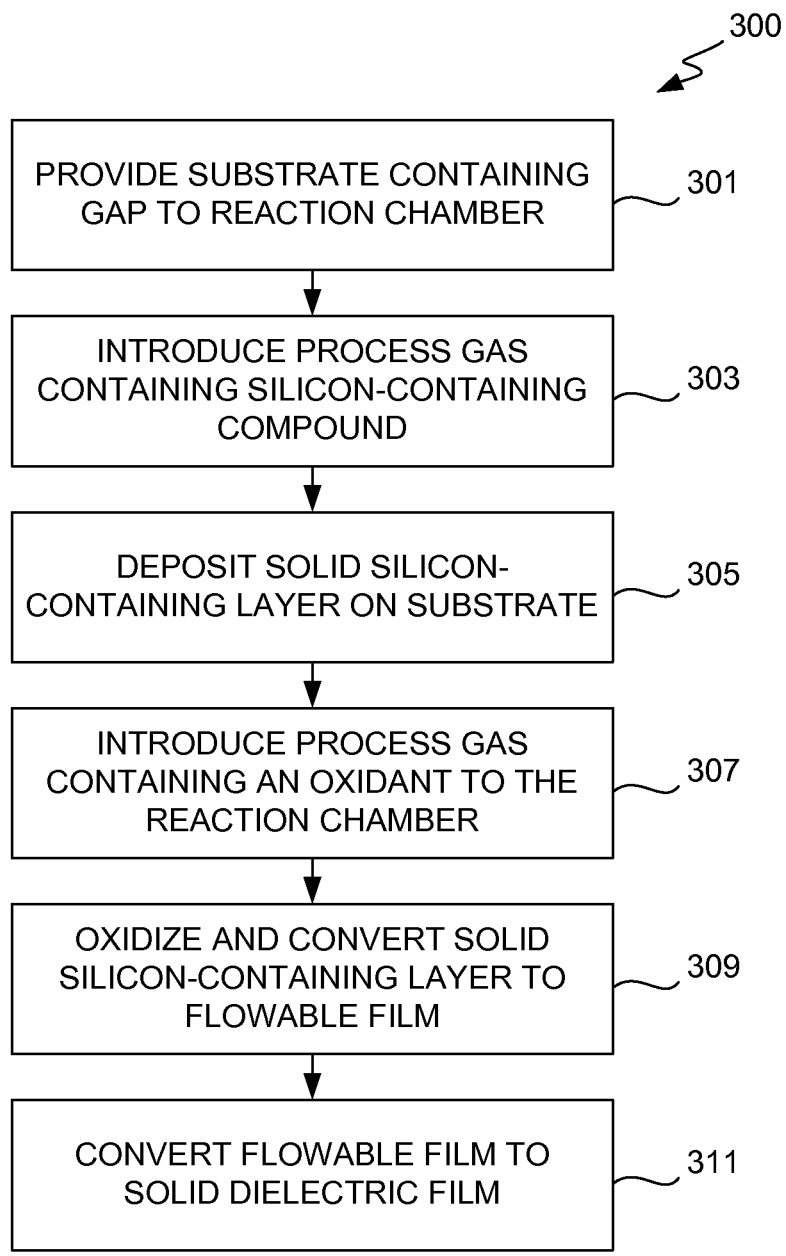
FIG. 3 is a process flow diagram depicting a method according to one embodiment of the invention.

An example of a process according to another embodiment is shown in FIG. 3. In this embodiment, the flowable film is formed by first depositing the silicon-containing precursor and then flowing steam to convert the film to the flowable liquid. As shown, the deposition process 300 begins at operation 301 in which a substrate containing a gap is provided to a reaction chamber. At operation 303, a process gas containing a silicon-containing precursor is introduced to the reactor. In this method, the process gas introduced in operation 303 does not contain an oxidant. Examples of silicon-containing precursors include TES and TEOS. A diluent gas such as helium or other suitable diluent may be used. Then in operation 305, a solid silicon-containing layer is deposited on the substrate. Low RF power (less than about 400 W) is typically used to deposit the film. Substrate temperature is also typically fairly low during this step, for example, less than about 100 C. In some embodiments, the temperature may be less than about 20 C. In a particular embodiment, the substrate temperature is subzero.

After the silicon-containing layer is deposited, a process gas containing an oxidant is introduced to the reaction chamber in operation 307. In specific example, the oxidant is $H_2O$ (steam). The process gas may be introduced with or without RF power. Substrate temperature is typically the same as for operation 305. The water or other oxidant oxidizes the solid film and converts it to a flowable film such as that described above with respect to operation 207 of FIG. 2 in operation 309. The oxidizer in one embodiment is water with a flow rate varying from 0.1 to 5 ml/min flow rate. One of skill in the art will understand that optimal flow rates depend on the degree of oxidation achieved and film conversion based on the kind of silicon precursor utilized The flowable film is then converted to a solid silicon oxide film in operation 311. A plasma or thermal anneal, as discussed above, may be used in operation 311.

In other embodiments of the invention, a dielectric precursor is selectively condensed in a gap. According to various embodiments, a thermodynamic effect due to which liquid remains selectively condensed in very narrow features is exploited. Under the certain physical conditions the precursor liquid is either selectively deposited only in the narrow features or the "bulk" precursor liquid is removed by evaporation while the liquid in the narrow features remains condensed. There, it is physically and/or chemically transformed to produce a solid deposition material (e.g., dielectric). By selectively depositing material in the narrow confined spaces of an integrated circuit, the process promotes "bottom up" filling. This results in the elimination of voids in the gap filling deposited material. The process has an additional advantage deriving from selective deposition in trenches and other gaps. As a result, excess material is not formed on top of the field regions and non-gap features of the partially fabricated integrated circuit. By reducing the quantity of such material, the invention reduces the need for expensive and time-consuming material removal process such as chemical mechanical polishing (CMP).

In a typical embodiment, the liquid phase deposition precursor is initially provided in a vapor phase at a partial pressure below its saturation pressure. Then, its partial pressure is gradually increased until it approaches the saturation pressure, at which point the material begins to condense as a liquid—first in the narrow trenches and other small features of the substrate. At the saturation pressure the liquid will begin to condense in the field. In one approach, the pressurization step is stopped just below the saturation pressure after the liquid has condensed in the features but before it condenses in the field. In a second approach, the partial pressure is increased to a point somewhere above the saturation pressure of the precursor. This relatively high partial pressure is maintained until at least all of the narrow gaps are completely filled with the liquid condensate. Typically, additional condensate (referred to herein as "bulk liquid") forms over the remainder of the substrate surface as well. To remove this bulk liquid while retaining the entrained liquid in the narrow features, the partial pressure of the precursor is now reduced to a point below its saturation pressure. At this pressure, the bulk liquid evaporates, while the liquid remains entrenched in the narrow features. This preference for liquid to remain condensed in the small spaces at pressures below the saturation pressure is due to the "Kelvin effect."

The invention is not limited to vapor phase introduction of the liquid into the narrow features. In other embodiments, the liquid may be introduced by immersion, spray on and/or spin on techniques, for example. In each of these instances, the liquid must be capable of penetrating into the narrow features where gap fill is desired.

At scales<100nm, the Kelvin effect is a significant contributor in determining phase equilibria in trenches, pores and high aspect ratio structures. If a liquid is in a confined space in contact with a surface which it wets, the liquid interface will have a curvature and a pressure differential will exist across the interface such that the pressure in the liquid is lower than the pressure in the vapor space above the interface. This will prevent the liquid from evaporating even though the ambient pressure is significantly lower than the saturation pressure. This implies that at conditions near saturation there would be selective condensation at the bottom of high aspect ratio structures due to the increased curvature of the film. This invention takes advantage of the propensity for liquids to condense preferentially and to remain condensed in small features. This propensity is employed to selectively fill narrow features with liquid. The resulting liquid, localized in small feature gaps is converted to the desired deposition material, typically a solid dielectric or metal. The invention makes use of the Kelvin effect in several different process sequences to achieve gap-fill in high aspect ratio features. The relevant thermodynamics of this process will be described in more detail below.

Figure 4A:
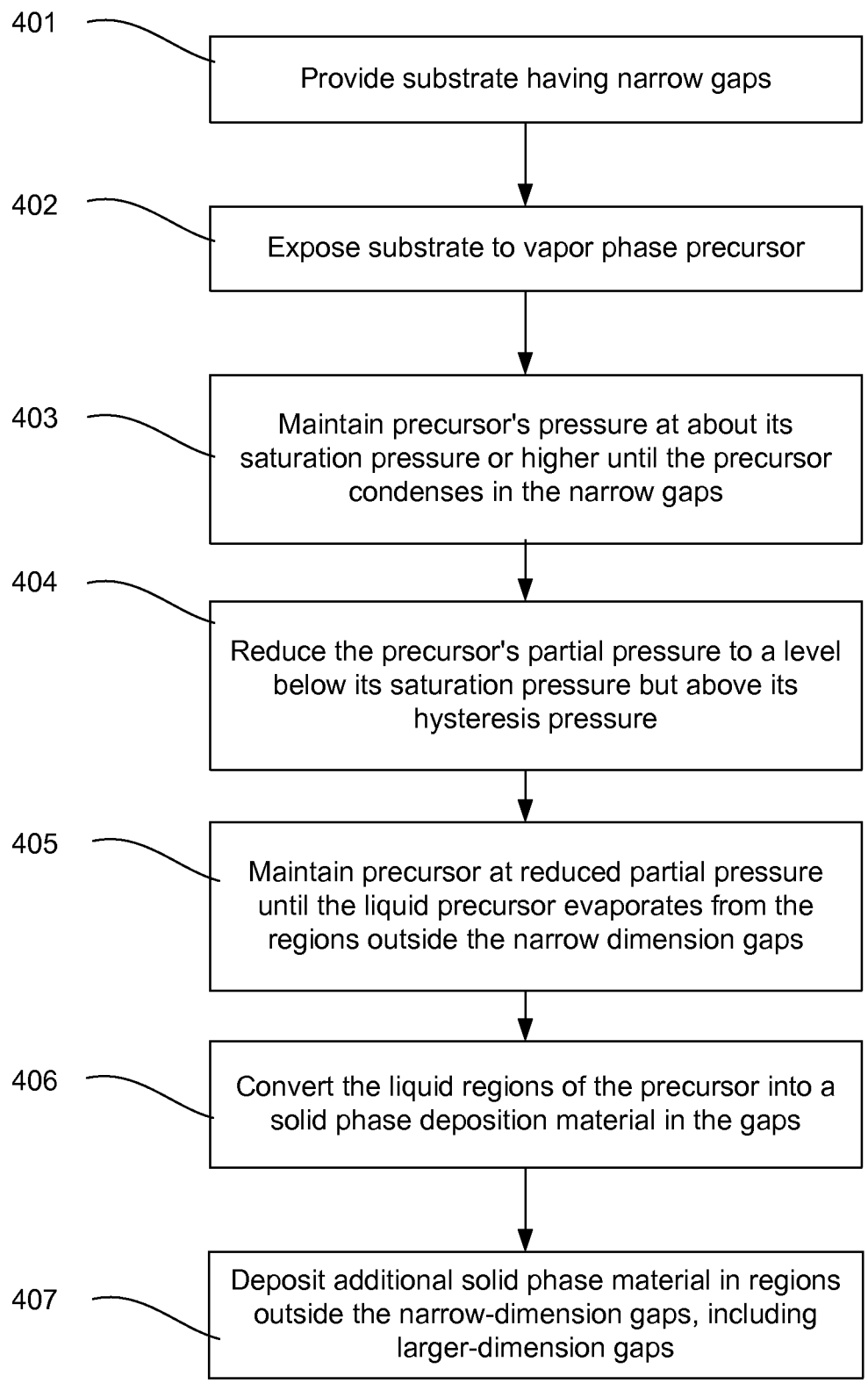
FIGS. 4a-4c are process flow diagrams, each depicting a method according to an embodiment of the present invention.

For context, one general process used to fill narrow-dimension gaps is illustrated in FIG. 4a. In an initial operation 401, a substrate having narrow gaps (e.g., openings on the order of about 100 nm or less) is provided. It is typically provided in a reaction chamber where the liquid precursor will be converted to a solid deposition layer. In some cases, however, the substrate may be initially provided in an environment that is not used for the actual deposition reaction. For many applications, the substrate is a partially fabricated integrated circuit or other electronic device. In such applications, the gaps may be defined by (a) trenches and vias for, e.g., shallow trench isolation, damascene line structures in dielectric layers, or storage capacitors, (b) gate electrodes in active devices, (c) vias for tungsten or copper interconnects, (d) metal lines after patterning, and the like.

In an operation 402, the substrate is exposed to a vapor phase precursor. Initially, the precursor may be provided at a partial pressure well below its saturation pressure. In this case, the precursor's partial pressure is then increased to about its saturation pressure or higher. This is not required, however, as the precursor may immediately have a partial pressure at or near its saturation pressure. Regardless of how the desired partial pressure (about saturation pressure or higher) is reached, it is maintained there until the precursor condenses in the narrow gaps. See operation 403. Typically, additional condensate (referred to herein as "bulk liquid") forms on the substrate surface and larger dimension gaps as well. To remove this bulk liquid while retaining the entrained liquid in the narrow features, operation 404 reduces the precursor's partial pressure to a level below its saturation pressure but above its "hysteresis pressure." Hysteresis pressure is the minimum partial pressure at which liquid remains in gaps of a defined size (under equilibrium conditions). The hysteresis pressure is below the saturation pressure. Note that if the pressure is driven too low (below the hysteresis pressure), even the liquid in the narrow features will evaporate. The concept of a hysteresis pressure will be explained further below. Thus, in an operation 405, the precursor's partial pressure is maintained at the reduced level until the liquid precursor evaporates from the regions outside the narrow-dimension gaps. While the partial pressure need not remain fixed during operation 405, it should reside within a window between the lower limit (the hysteresis pressure) and the saturation pressure. Alternatively, the partial pressure of the liquid precursor may also be brought below the saturation pressure by increasing the saturation pressure by heating the substrate or the chamber.

With the liquid precursor now selectively confined to narrow dimension gaps, it may be appropriate to take advantage of this localization to selectively form structures in the gaps. Thus, in an operation 406, the liquid regions of the precursor are converted into a solid-phase deposition material. This conversion may be achieved physically for example simply by solidification or chemically by reacting the precursor liquid regions with another material to produce the solid material or by decomposing or polymerizing the precursor using, for example, thermal or ultraviolet means. Finally, in an optional operation 407, additional solid-phase material is deposited in regions outside of the narrow-dimension gaps, including the larger dimension gaps that were not filled by the above process. This additional deposition may be accomplished using a conventional process such as CVD, physical vapor deposition (PVD), plasma assisted chemical vapor deposition (PECVD), high density plasma (HDP), spin on techniques, atomic layer deposition (ALD), pulsed nucleation layer (PNL) deposition, pulsed deposition layer (PDL), plating techniques (including electroplating and electroless plating), etc. Alternatively, it may be accomplished by making use of the Kelvin effect as described above, but with different precursors or under different partial pressures or with a different process sequence, etc. as appropriate for larger gap structures.

Figure 4B:
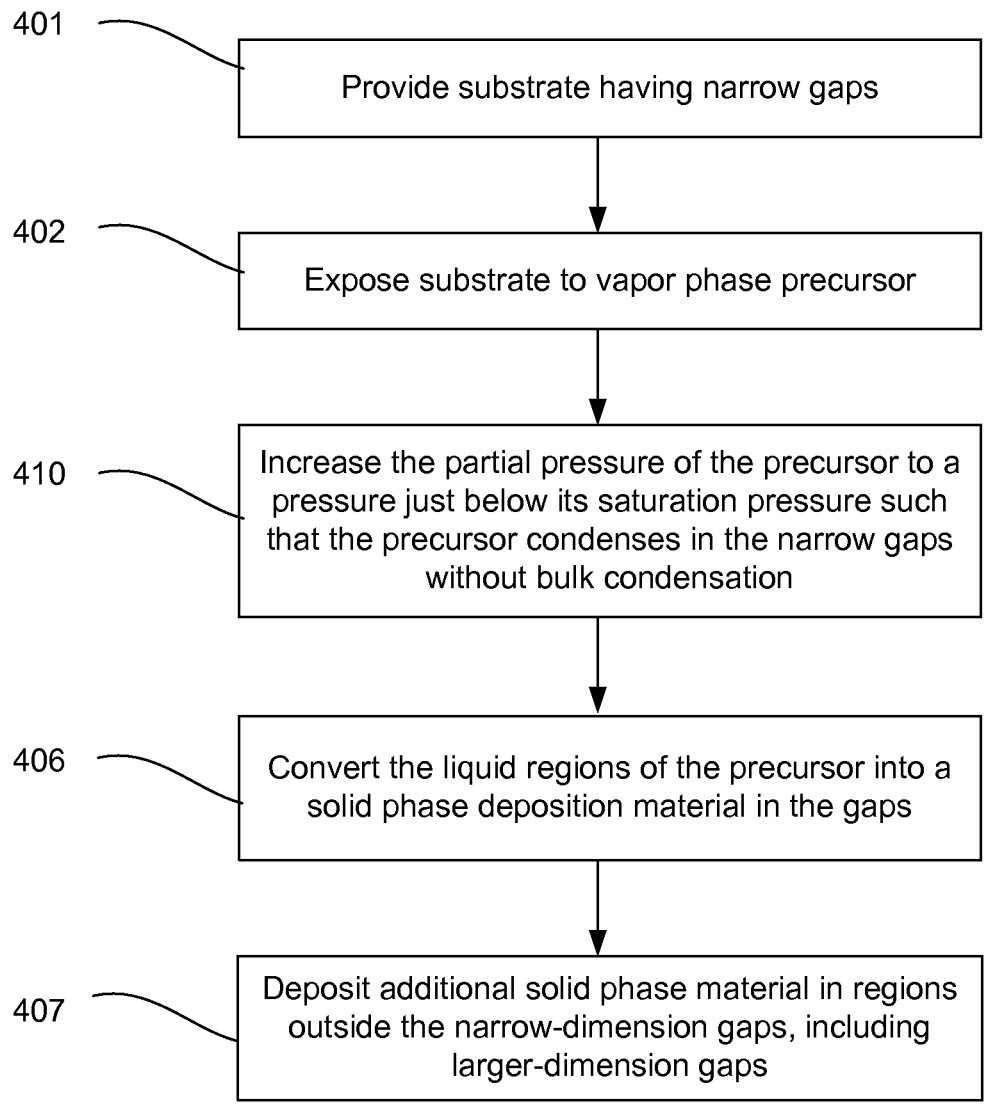

A second general process used to fill narrow-dimension gaps is illustrated in FIG. 4b. Operations 401, 402, 406 and 407 are described above in reference to FIG. 4a. Following 401 and 402 is operation 410, wherein the precursor's partial pressure is increased to a pressure just below its saturation pressure such that the precursor condenses in the narrow gaps without bulk condensation. Steps 406 and 407 are then performed as described in reference to FIG. 4a.

Figure 4C:
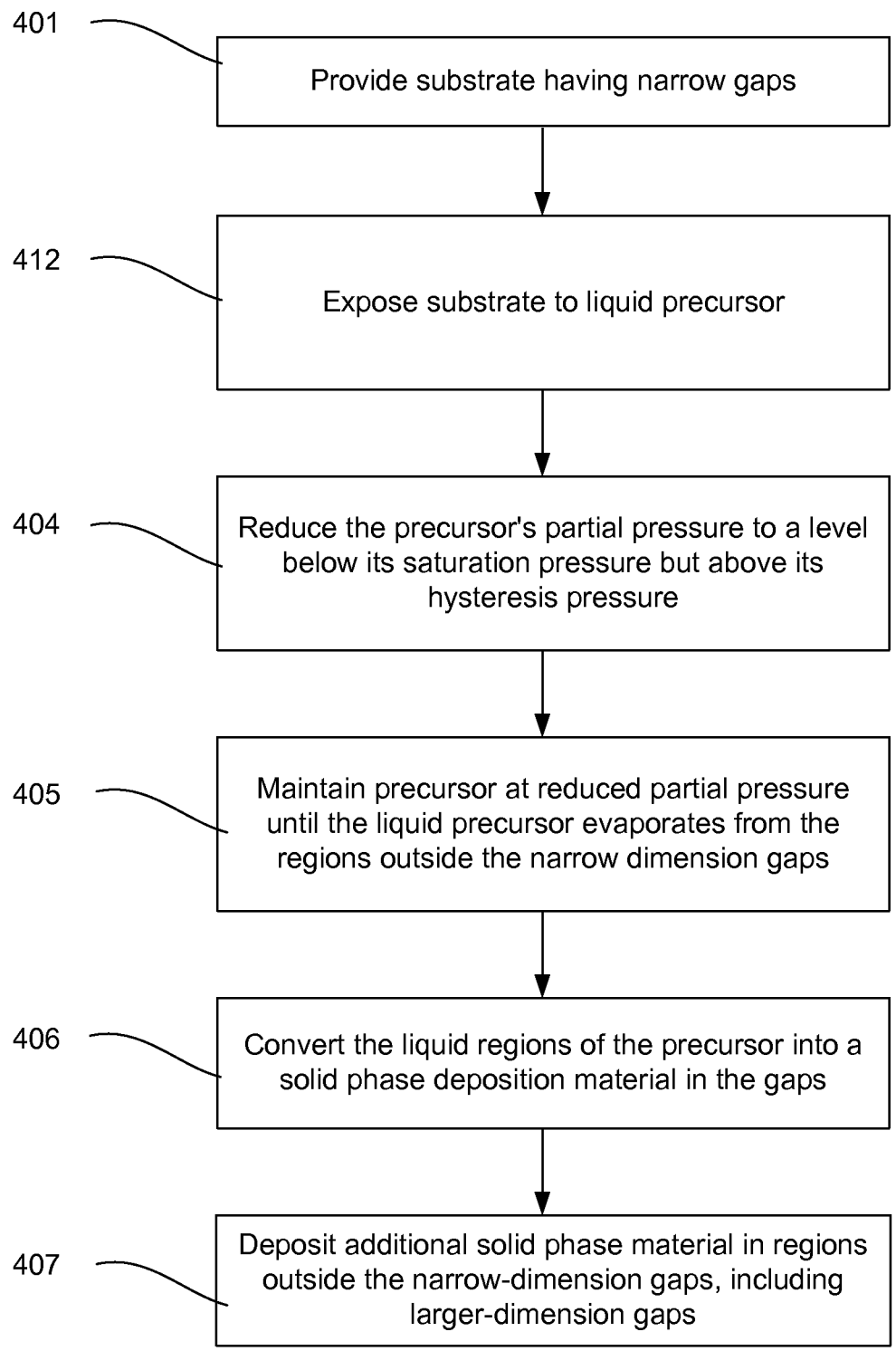

A third general process is illustrated in FIG. 4c. In this implementation of the invention, steps 401, 404, 405, 406, and 407 are performed in the same manner as in reference to FIG. 4a. In place of step 402, step 412 is performed, wherein the substrate is exposed to a liquid precursor (e.g. by dip casting, spray on, print on, or spin on methods). Step 403 is omitted.

To illustrate the selective condensation due to the Kelvin effect, one can visualize what happens if a wafer with gap features less than 100 nm is brought in contact with a pure fluid (in vapor phase) at a temperature below its critical point and the fluid is pressurized to is saturation pressure and then depressurized as shown in FIGS. 5a-5e. These figures present cross-sections showing gaps typically encountered in shallow trench isolation applications. As shown, a pad nitride 505 (or other hard mask material) defines field regions 504 and trenches 506. In this example the trenches 506 are formed in a silicon substrate and assumed to have a width of not more than about 100 nanometers. The sidewalls of trenches 506 are lined with a nitride liner 508. Of course, other structures with gaps of similar dimensions will also exhibit the Kelvin effect as depicted in FIGS. 5*a*-5*e*. Structures of different shapes for examples vias or trenches or islands or structures with reentrant gaps will also exhibit the same qualitative behavior with some quantitative differences.

Figures 5A, 5B, 5C, 5D, 5E:
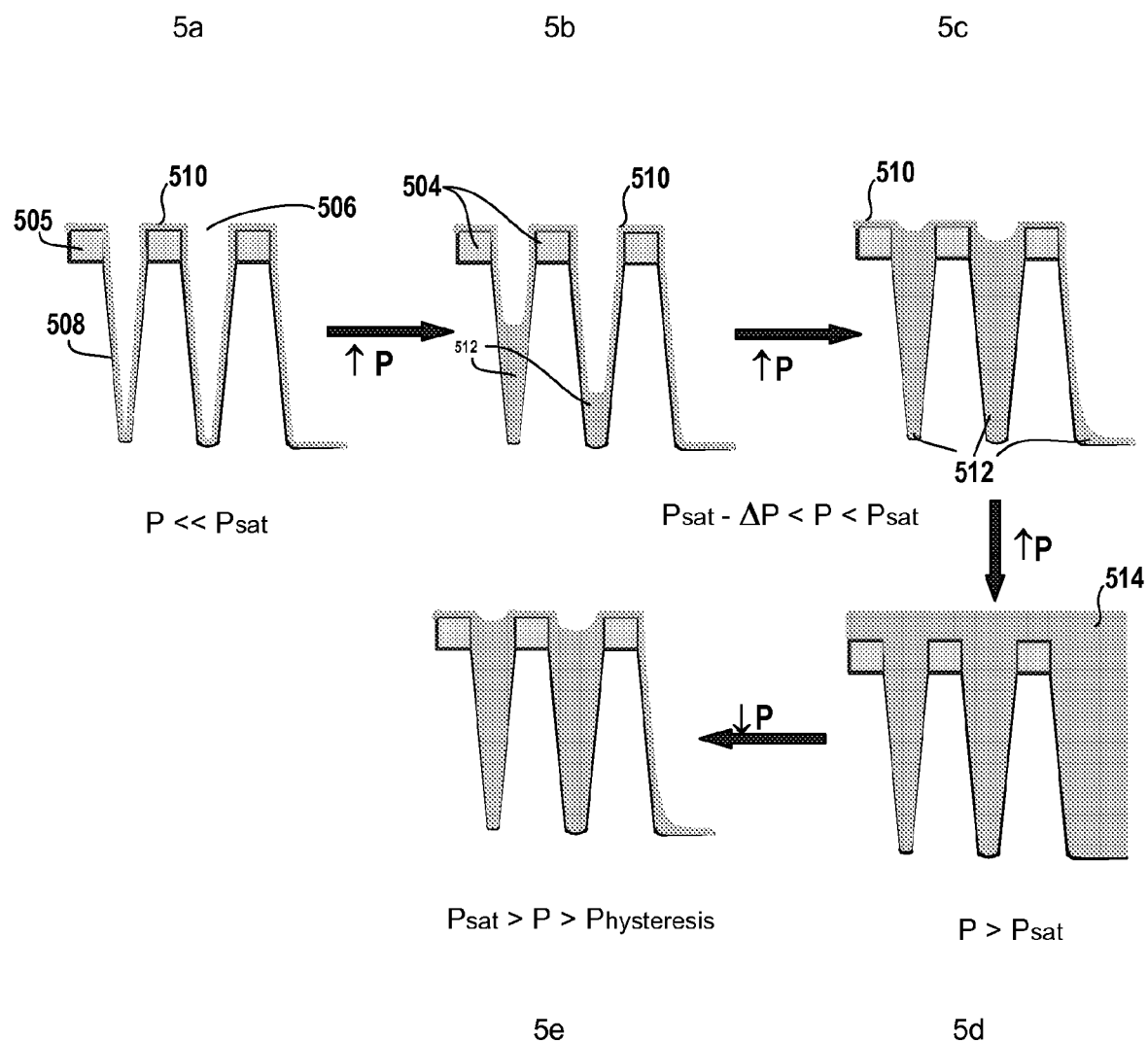
FIGS. 5a-5e illustrate a series of cross sections of a substrate with gap features of size less than 100 nm. The cross sections follow an exemplary process of this invention.

In FIG. 5*a*, the material in question is present entirely as a vapor phase fluid at a partial pressure much lower than saturation pressure. At this pressure, some of the material is adsorbed onto the surface of the substrate to form a minimal adsorption layer 510, with no liquid phase yet in existence. When the partial pressure of the fluid is raised to a point just below its saturation pressure, as shown in FIGS. 5*b* and 5*c*, the fluid starts to condense in the smaller features and in the corners of the larger features. This is due to the curvature of the adsorbent layer 510, which has characteristics of the liquid film. Note that, as the fluid starts to condense, the narrower features are filled first. See condensed fluid in regions 512. As shown in FIG. 5*c*, if the fluid's partial pressure is maintained in this range (at or near saturation pressure, but not significantly above saturation pressure), the vapor condenses in the narrow dimension trenches 506, but not elsewhere.

In FIG. 5*d*, the partial pressure of the fluid has been raised to a level above its saturation pressure, and fluid in the chamber condenses to a liquid state over the entire substrate. This includes large dimension gaps as well as field regions. The condensate in these regions is referred to as bulk liquid. See condensate 514 in FIG. 5*d*. Next, as shown in FIG. 5*e*, the chamber is slowly depressurized and the bulk fluid 514 vaporizes while the condensate 512 remains entrained in the smaller features. During the depressurization step, the curved interface is due to the condensed liquid in the features (rather than the absorbed film) and the curvature of this interface is much greater leading to a much larger Kelvin effect. This causes a hysteresis loop in pressurization-depressurization cycle. Note that in the features in FIG. 5, the neck dimension is larger than the rest of the feature. This process, however, is even more effective in instances where the neck dimension is smaller than or approximately equal to the rest of the feature. Thus, the Kelvin effect (and the range of applicability of this invention) extends to reentrant features, features with faceted openings, straight features, sloped features, etc. This process provides for gap fill without voids, weak spots or seams as are often seen in directional or conformal gap-fill processes. Also, gap-fill by this method does not encounter forbidden gaps as is common with ALD type techniques where intermediate gap sizes are made inaccessible to bulk fill techniques.

Figure 6:
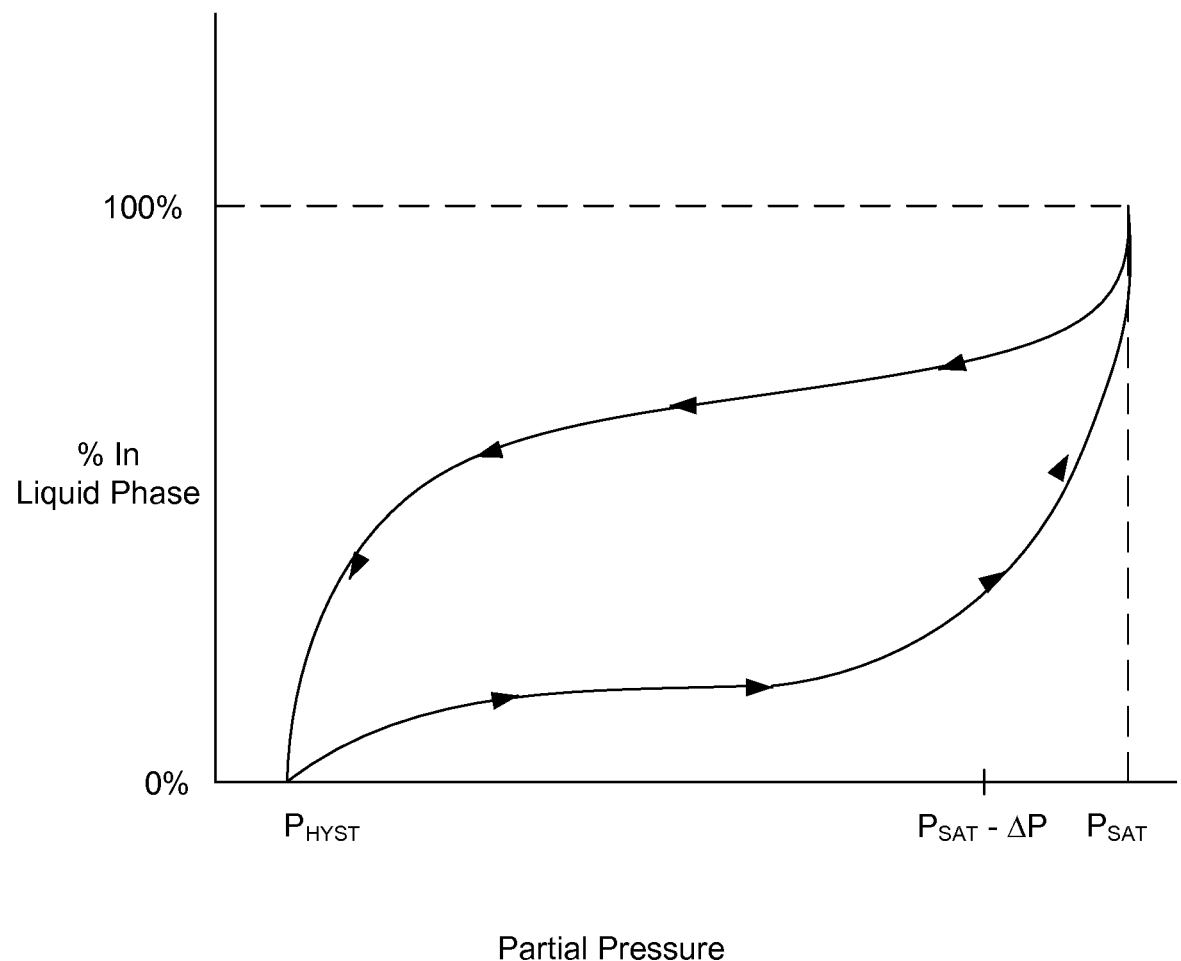
FIG. 6 illustrates the relationship between percent liquid phase (of a two phase component) and partial pressure of the component in small gap. The depicted hysteresis in the relationship results from the Kelvin effect.

FIG. 6 illustrates a generic hysteresis loop in a condensation-vaporization cycle due to the Kelvin effect in small-dimension features. The vertical axis has units of percentage of fluid in the liquid phase (100×mass of liquid/(mass of liquid+vapor)). The horizontal axis has units of partial pressure of the fluid. Initially, at very low pressure, the fluid is entirely in the gas phase (with some small quantity physically adsorbed on the surface). As the fluid's partial pressure approaches $P_{sat}$ at a pressure $P_{sat}-\Delta P$, condensate begins to form in the narrow dimension features and corners of larger features. The arrows on the graph indicate the direction of partial pressure change. As partial pressure is increased, formation of condensate is increased. Eventually, as pressure is raised to $P_{sat}$ and maintained at that pressure, 100% of the fluid will be in the liquid phase. In one embodiment of this invention where a pressurization-depressurization cycle is used, the direction of pressure change reverses so that fluid's partial pressure begins decreasing. Initially, some of the liquid begins vaporizing and the % liquid phase begins decreasing. The liquid depressurization curve may for a time follow the path of the pressurization curve as the bulk liquid and liquid in the large features evaporates. At some point, however, the small features will influence the process so that the Kelvin effect leads to an observed hysteresis, i.e., relatively more fluid will remain in the liquid phase for any given pressure (during depressurization). If there were no small dimension features, no hysteresis would be observed. As the partial pressure continues to decrease, it will cross below the pressure at which fluid first began to condense during pressurization. However, on the return path (depressurization), a significant amount of liquid remains entrained in the narrow dimension features and corners due to the presence of the curved vapor-liquid interface. Eventually, as the fluid's partial pressure continues to drop, even the liquid in the narrow features will evaporate. The point at which all fluid evaporates from narrow features during depressurization is referred to herein as the hysteresis pressure, $P_{hyst}$.

In one method of practice of this invention where single or multiple pressurization-depressurization cycles are employed, it is important to use a final partial pressure within a window between a lower limit (referred to herein as the hysteresis pressure, $P_{hyst}$) and the saturation pressure. By operating below the saturation pressure, most if not all of the bulk liquid should evaporate. By operating above the hysteresis pressure, at least some liquid will remain entrained in the narrow dimension features. The above explanation suggests an embodiment of this invention: initially the substrate is provided with bulk liquid and liquid in narrow dimension features, and then the pressure is decreased to a point between the hysteresis pressure and the saturation pressure and held there until the bulk liquid is removed and some liquid remains in the narrow dimension features. The initial wetting of the substrate may be accomplished in various ways including immersion, spraying, spin on techniques, etc. Of course, it may also be accomplished by exposure to vapor phase fluid at a partial pressure well above the fluid's saturation pressure. It can remain in this state until at least the narrow dimension features are filled with liquid. Typically, some amount of bulk liquid will also be formed.

The size of the hysteresis loop depends on the magnitude of the Kelvin effect and therefore on the feature size and shape as well as the surface tension of the liquid and can be calculated as the change in free energy due to evaporation of a differential volume ($\Delta V$) of liquid in the confined space which equals the change in surface area ($\Delta A$) times the surface tension as:

$$n\Delta G = -(\Delta V)\rho_{cond}RT\ln\left(\frac{f}{f_{sat}}\right) = (\Delta A)\gamma\cos\theta \qquad [1]$$

where, $\gamma$ is the surface tension, $\theta$ is the contact angle, $\rho_{cond}$ is the density of the condensed phase fluid, f and fsat are the fugacities at pressures P and $P_{sat}$.

For a trench on a wafer (assumed to be a rectangular one-dimensional trench with width d), equation 1 reduces to:

$$\left(\frac{f}{f_{sat}}\right) = \exp\left(-\frac{2\gamma\cos\theta}{\pi d \rho_{cond}RT}\right) \qquad [2]$$

Similar equations can be derived for different feature shapes. For fluids at relatively low partial pressures, fugacity can be approximated by pressure. The main variables in applications of this invention include "d," the trench width and f, the fugacity associated with the hysteresis pressure, the maximum pressure at which some fluid remains entrained in trenches of width d during depressurization.

Figure 7:
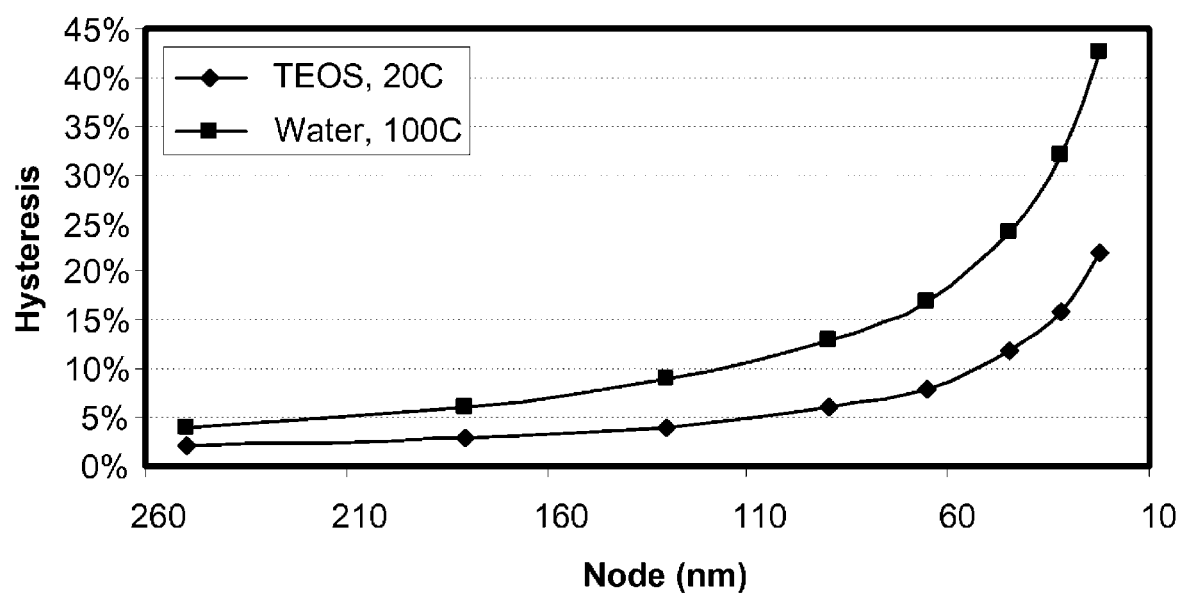
FIG. 7 shows how the magnitude of the hysteresis effect (due the Kelvin effect) varies as a function of feature size (as illustrated by the gap width for linear trenches) for water at 100° C. and TEOS at 20° C.

This phenomenon is exploited in this invention to allow for gap-fill in small features and trenches, which are essentially, confined spaces. As should be obvious by now, for a feature size of 45 nm, the fluid may exist as a liquid at pressures well below the saturation pressure. FIG. 7 shows the "size" of the hysteresis loop as calculated by equation 2 for water at 100° C. and TEOS at 20° C. in trenches as a function of feature size. On the vertical axis, percent hysteresis is calculated by using equation 3:

$$\% \text{ Hysteresis} = \frac{P_{Sat} - P_{Hyst}}{P_{Sat}} \quad [3]$$

As the feature length scales shrink, this selective condensation effect becomes stronger, and provides a wider process window. In other words, at smaller dimensions, d, there is a wider range of operational partial pressures for which liquid will remain selectively entrained in narrow dimension features. The horizontal axis, which corresponds to dimension d, is the gap width associated with the technology node for IC fabrication. At the 180 nanometer gap width, the percent hysteresis is only relatively small. Dropping to the 130 nanometer node and then the 70 nanometer node and beyond gives wider and wider process ranges. FIG. 4 plainly illustrates the increased importance of the Kelvin effect as feature sizes become smaller. Thus, while the invention may be used profitably for substrates features having principal dimensions on the order of 100 nanometers, it will find increasing benefit for substrates having features with even smaller principal dimensions, on the order of 80 nanometers, 50 nanometers, and beyond.

In terms of features on a substrate surface, this process is generally applicable to any substrate having gaps that fall within the "mesoporous" domain. It generally includes gaps having a dimension of about 100 nm or less. The invention also finds particular usefulness in the context of gaps having relatively high aspect ratios (e.g., at least about 6:1, and sometimes 10:1 or above) and in the context of features having a neck dimension narrower than the remainder of the feature. Although, as indicated above, the invention may be employed with features of essentially any shape, including features with straight and/or sloped sidewalls, features with faceted openings, reentrant features, etc.

It is notable that many substrates have a wide range of gaps sizes and shapes to be filled. The present invention is useful to fill the narrowest of these. In the larger features, the Kelvin effect is much less significant, and the liquid phase precursor will evaporate when the partial pressure of the precursor is reduced slightly below the saturation pressure (i.e., the window defined by percent hysteresis is too small to be useful). Thus, the larger gaps can be filled with a second process such as conventional CVD, plasma enhanced chemical vapor deposition (PECVD), including high density plasma chemical vapor deposition (HDP CVD), physical vapor deposition (PVD), atomic layer deposition (ALD), subatmospheric chemical vapor deposition (SACVD), electroplating, electroless plating, etc.

As noted above, various precursors may be used depending on the desired deposition material. In general, the precursor should have a saturation pressure that is reasonable for the range of temperatures and pressures available for the process under consideration. As indicated by equation 2, its liquid phase density, surface tension, and contact angle should be appropriate for providing a relatively large window of operation ($P_{sat}-P_{hyst}$).

If a silicon oxide dielectric material is needed, precursors such as silanes and siloxanes may be appropriate. Examples of suitable silica-forming compounds include TES, TEOS, tetramethoxysilane (TMOS), an organic alkoxysilane such as methyl triethoxysilane (MTEOS), methyltrimethoxysilane (MTMOS), dimethyldimethoxysilane (DMDMOS), trimethylmethoxysilane (TMMOS), dimethyldiethoxysilane (DMDEOS), a bridged siloxane such as bis-triethoxysilylethane (BTEOSE) or bis-triethoxysilylmethane (BTEOSM), a cyclic siloxane such as tetramethylcyclotetrasiloxane (TMCTS), octamethylcyclotetrasiloxane (OMCTS), tetravinyltetramethylcyclotetrasiloxane (TVTMCTS) and mixtures of these precursors. Another class of dielectric precursors is the polysilazanes including perhydropolysilazanes $(SiH_2NH_2)_n$, where n is an integer. These precursors have been applied as gapfill precursors using a spin on technique as discussed in U.S. Pat. No. 6,479,405, which is incorporated herein by reference for all purposes. In the current invention, similar polymeric precursors of appropriate molecular weight can be applied for gapfill by condensing from the vapor phase or by first applying to the substrate in the liquid phase followed by evaporation of the bulk liquid by the depressurization technique described previously.

In a typical scenario, the precursor liquid may be reacted with another material to produce the desired solid material. For example, an acid or base catalyzed TEOS condensation process can be achieved selectively in small features by using a multi-step process in which the first reactant TEOS is first condensed inside the features by pressurizing TEOS vapor to pressures greater than $P_{sat}$. The chamber is then depressurized to a pressure $P_{sat}-\Delta P$ that is within the hysteresis loop for the largest target feature size. The ambient fluid is a vapor while the features are filled with liquid TEOS. Then the second reactant (water/steam, ozone or peroxide) and catalyst (acid, e.g. HCl or base e.g. NH3) is added in such a manner that it preferentially partitions into the liquid phase where the reaction occurs to form a silicon dioxide.

The same reaction can be carried out in a single step process, where both reactants are introduced into the chamber simultaneously and the pressure is slowly increased to a pressure just below the saturation pressure such that condensation and subsequent reaction occurs only in the target features. The precursor(s) may also be mixed in a carrier solvent. Multiple pressure or temperature cycles can also be used to enhance mass transfer of reactants or by-products.

Alternately, the precursor liquid may be converted into a solid material via decomposition of the precursor in the liquid regions. For example, thermal decomposition or ultraviolet processes may be used.

With the choice of suitable chemistry and processing conditions, the film can be deposited in an entirely bottom-up manner, with the highest growth rate in the smallest structures.

In certain embodiments, the precursor(s) may be the vapor or liquid form of the final solid gapfill material. The gap-fill may be accomplished at an elevated temperature such that the material filling the features is a liquid, which subsequently solidifies as the substrate is cooled.

In any gap fill application where a doped material is desired, the dopant may be introduced by various procedures. For example, if a dopant precursor has appropriate phase equilibria properties, it may be introduced simultaneously as a vapor mixture. The dopant may also be introduced sequentially.

Apparatus

The methods of the present invention may be performed on a wide-range of reaction chambers. The methods may be implemented on any chamber equipped for deposition of dielectric film, including HDP-CVD reactors, PECVD reactors, any chamber equipped for CVD reactions, and chambers used for PDL (pulsed deposition layers).

The methods of the present invention can be implemented in many different types of apparatus. Generally, the apparatus will include one or more chambers or "reactors" (sometimes including multiple stations) that house one or more wafers and are suitable for wafer processing. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation). The various stations may be wholly or partially isolated by virtue of gas curtains, walls, etc. In such cases, the substrate may be indexed between different stations during a multistage process.

In certain embodiments, the present invention may be implemented in a HDP CVD reactor. An example of a suitable reactor is the Speed™ reactor, available from Novellus Systems of San Jose, Calif. In certain embodiments, the present invention may be implemented in a PECVD reactor. Examples of suitable reactors are the Sequel™ reactor and the Vector™ reactor, both available from Novellus Systems of San Jose, Calif. In certain embodiments, the present invention may be implemented in a CVD chamber equipped for metal and/or dielectric deposition. An example of a suitable reactor is the Altus™ reactor available from Novellus Systems of San Jose, Calif. In certain embodiments, the present invention may be implemented in a chamber equipped for atomic layer deposition (ALD), pulsed deposition layer (PDL), or pulsed nucleation layer (PNL) reactions. An example of such a reactor is the Altus™ with PNL reactor available from Novellus Systems of San Jose, Calif.

Figure 8:
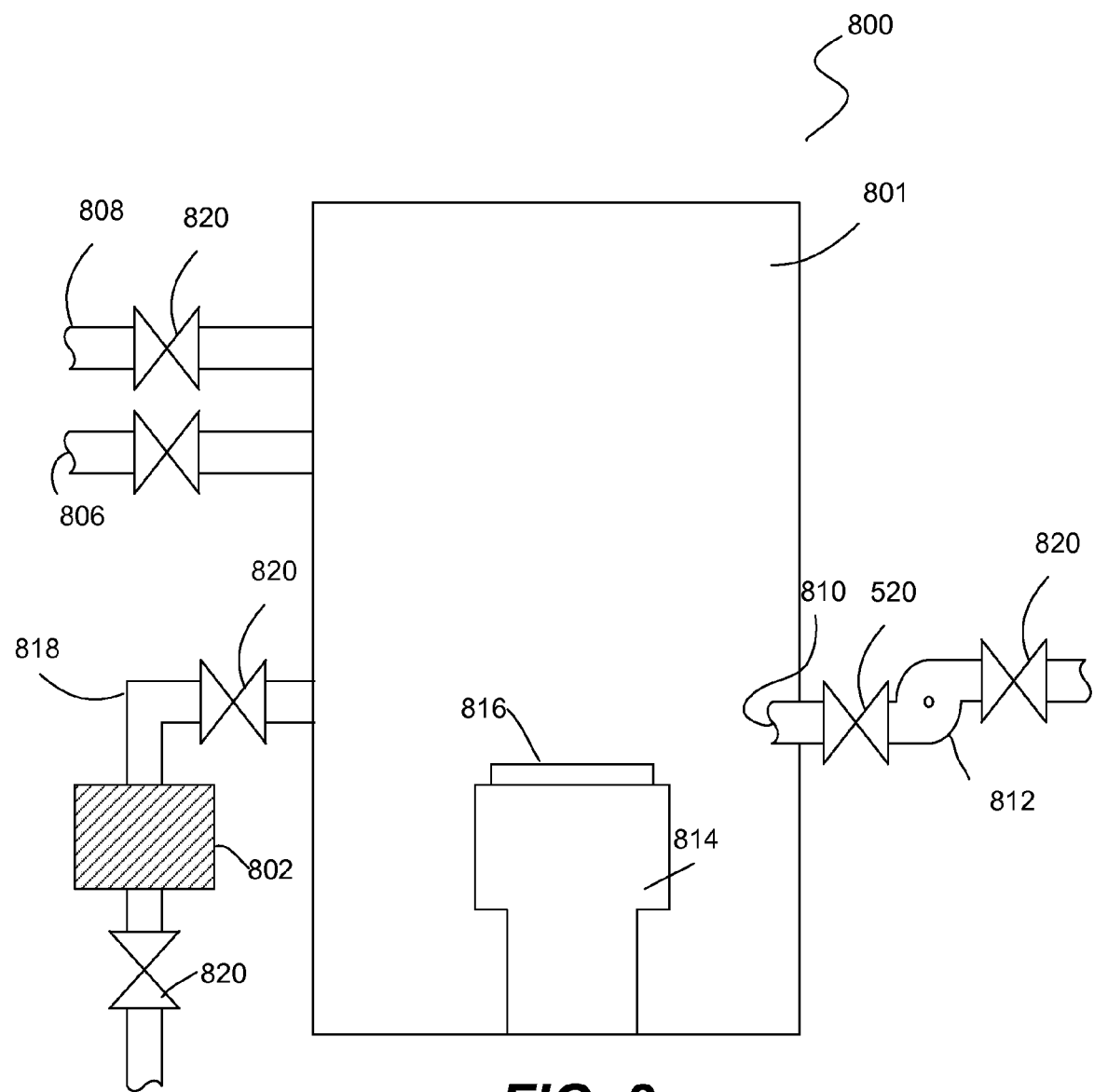
FIGS. 8-10 are block diagram depicting some components of various reactors suitable for performing certain embodiments of the invention.

FIG. 8 provides a simplified schematic depicting one preferred embodiment of the invention. As shown, a reactor 800 includes a process chamber 801, which encloses other components of the reactor. A substrate 816 (e.g., a partially fabricated integrated circuit) is placed upon a pedestal 814. The pedestal may have an active temperature control system (not shown) to heat or cool the wafer. A vacuum pump 812 is used to evacuate the air from process chamber 801 via vacuum line 810. Isolation valves 820 are used to retain the vacuum after the pump is turned off. The chamber can be pressurized and de-pressurized using an accurate pressure control system (not shown). A precursor is provided in vessel 802 and allowed to sublimate (if a solid) or evaporate (if a liquid) into a carrier gas feed line 818. Alternately, a gas phase precursor may be supplied (not shown). The precursor flow rate may be controlled, for example, by altering the temperature of a liquid (or solid), by controlling the flow rate or residence time of the carrier gas, or by controlling the flow rate of a diluent gas to the chamber. The relevant isolation valve 820 may be used to separate the precursor vapor from the reactor and the carrier gas until a desired time. When the valve is then opened, a carrier gas forces the precursor vapor into the chamber. The carrier gas may be any inert gas, such as nitrogen or argon. A diluent gas may be supplied through carrier line 806. The diluent gas may be any inert gas such as noble gas (e.g., helium or argon), nitrogen (depending on the process), carbon dioxide (depending on the process), etc. If desired, a second reactant gas is supplied through line 808.

As indicated above, in certain embodiments, deposition is followed by a conversion to solid film that involves a thermal, UV, microwave or plasma process. These deposition sand conversion operations are performed in the same reaction chamber. In other embodiments, the deposition may be performed in a first chamber and then transferred to a second chamber for a thermal or plasma anneal. For example, reactors that are configured for plasma reactions may be used for both the deposition and plasma anneal operations. Other reactors may be used for deposition and thermal anneal operations.

Figure 9:
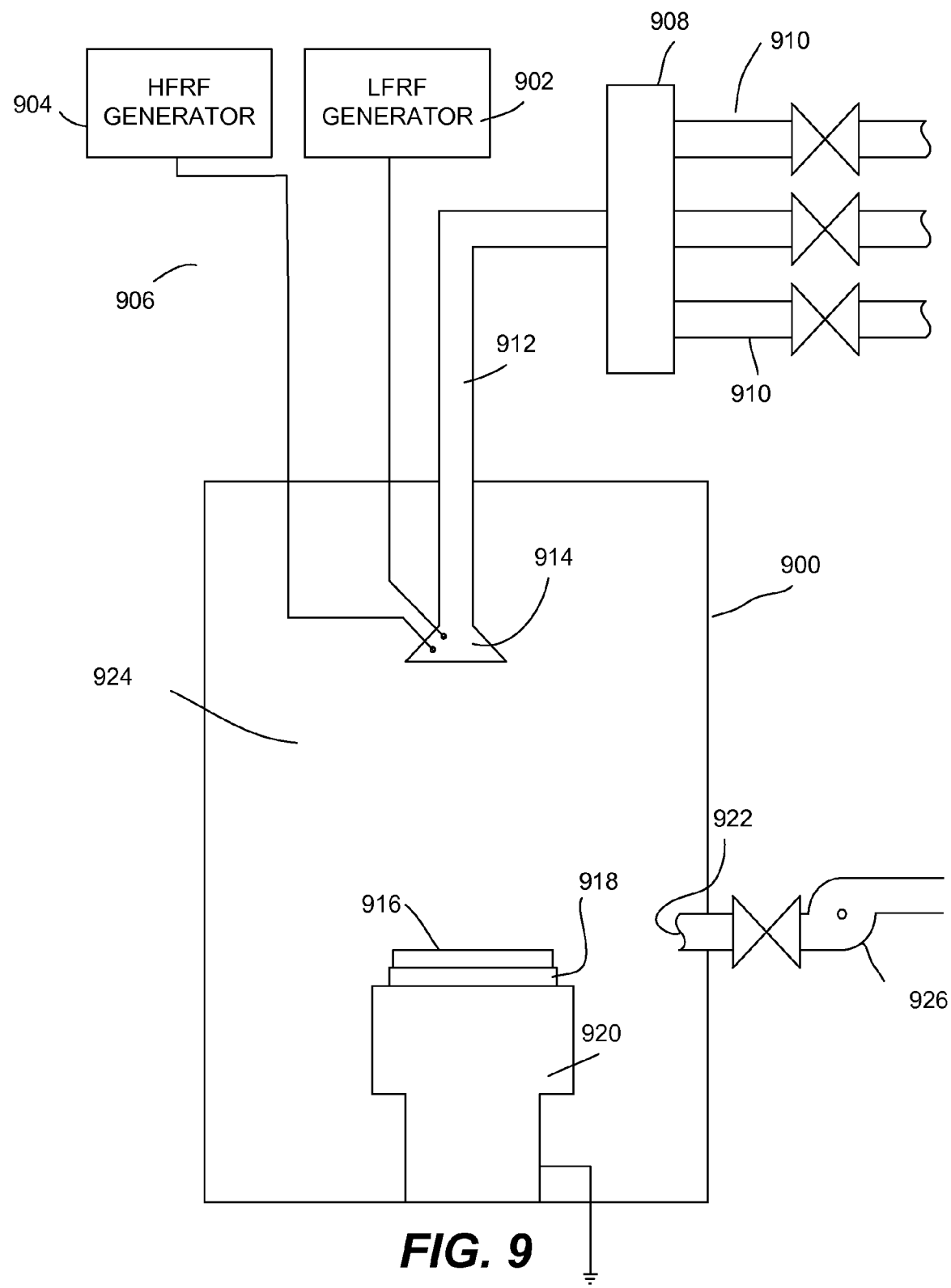

FIG. 9 shows an example of a reactor that may be used in accordance with certain embodiments of the invention. The reactor shown in FIG. 9 is suitable for both the dark deposition and conversion to a solid film, for example, by plasma anneal. As shown, a reactor 900 includes a process chamber 924, which encloses other components of the reactor and serves to contain the plasma generated by a capacitor type system including a showerhead 914 working in conjunction with a grounded heater block 920. A low-frequency RF generator 902 and a high-frequency RF generator 904 are connected to showerhead 914. The power and frequency are sufficient to generate a plasma from the process gas, for example 400-700 W total energy. In the implementation of the present invention, the generators are not used during dark deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 918 supports a substrate 916. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 912. Multiple source gas lines 910 are connected to manifold 908. The gases may be premixed or not. The temperature of the mixing bowl/manifold lines should be maintained at levels above the reaction temperature. Temperatures at or above about 80 C at pressures at or less than about 20 Torr usually suffice. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 900 via an outlet 922. A vacuum pump 926 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 10:
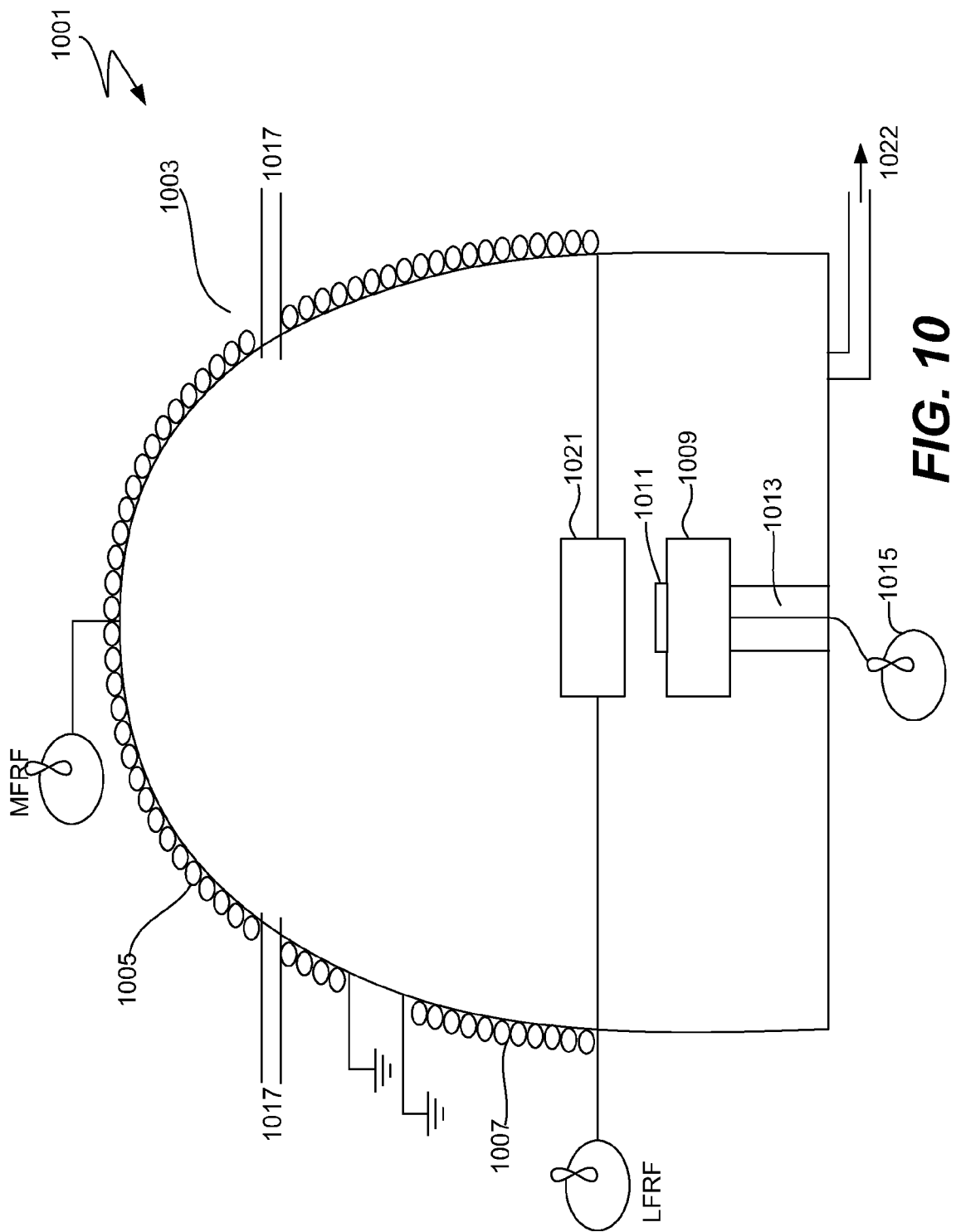

It should be noted that the apparatus depicted in FIG. 9 is but one example of an apparatus that may be used to implement this invention. FIG. 10 provides a simple block diagram depicting various reactor components arranged as may be arranged in a HDP-CVD reactor that may be used in accordance with the invention. As shown, a reactor 1001 includes a process chamber 1003 which encloses other components of the reactor and serves to contain the plasma. In one example, the process chamber walls are made from aluminum, aluminum oxide, and/or other suitable material. The embodiment shown in FIG. 10 has two plasma sources: top RF coil 1005 and side RF coil 1007. Top RF coil 1005 is a medium frequency or MFRF coil and side RF coil 1007 is a low frequency or LFRF coil. In the embodiment shown in FIG. 10, MFRF frequency may be from 430-470 kHz and LFRF frequency from 340-370 kHz. However, the invention is not limited to operation in reaction chambers with dual sources, nor RF plasma sources. Any suitable plasma source or sources may be used.

Within the reactor, a wafer pedestal 1009 supports a substrate 1011. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 1013 for supplying heat transfer fluid controls the temperature of substrate 1011. The wafer chuck and heat transfer fluid system can facilitate maintaining the appropriate wafer temperatures.

A high frequency RF of HFRF source 1015 serves to electrically bias substrate 1011 and draw charged precursor species onto the substrate for the deposition reaction. Electrical energy from source 1015 is coupled to substrate 1011 via an electrode or capacitive coupling, for example. Note that the bias applied to the substrate need not be an RF bias. Other frequencies and DC bias may be used as well.

The process gases are introduced via one or more inlets 1017. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 1021, which may or may not direct the gases toward the substrate surface. Injectors may be connected to the primary gas ring 1021 to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 1003 via an outlet 1022. A vacuum pump (e.g., a turbomolecular pump) typically draws process gases out and maintains a suitably low pressure within the reactor.

In certain embodiments, high-cost features of the Speed™ or other HDP-CVD tool may be eliminated. For example, the present invention may be implemented on a HDP-CVD reactor without a dome and/or turbo-molecular pumps.

As indicated above, in certain embodiments, a CVD reactor may include a baffle assembly. FIG. 11 shows an embodiment of a CVD reactor that includes a baffle plate assembly. As shown in FIG. 11, oxidant and silicon-containing precursor (as well as any dopant, carrier or other process gases) enter the reactor 1101 through showerhead 1103 above pedestal 1105, which supports the wafer. In the example depicted in FIG. 11, $H_2O$ and TES are the oxidant and silicon-containing precursor, respectively. The inert gas enters the chamber below baffle plates 1107 at inlet 1109. In certain embodiments, the baffle plate is physically connected to chamber body at the gas ring. A chamber manometer may also be located below the baffles. Use of the baffle plate and inert gas ballast increases reactant residence time. In one example, a flow of 2000 sccm He is used to provide the inert gas ballast. Baffle plates 1107 may have holes that may be opened or closed.

Experimental

The following examples provide details illustrating aspects of the present invention. These examples are provided to exemplify and more clearly illustrate these aspects of the invention and are in no way intended to be limiting.

A flowable film was deposited in gaps on a substrate under dark conditions as described above with reference to FIG. 2. Substrate temperature was around room temperature for the deposition. The precursors used were TES (tri-ethoxy silane) and steam.

After deposition, the film was exposed to an oxygen plasma for 270 seconds. Oxygen flow rate was 500 sccm and RF power was 9000 W. The wafer substrate temperature during the plasma treatment was ~500 C.

Figure 12:
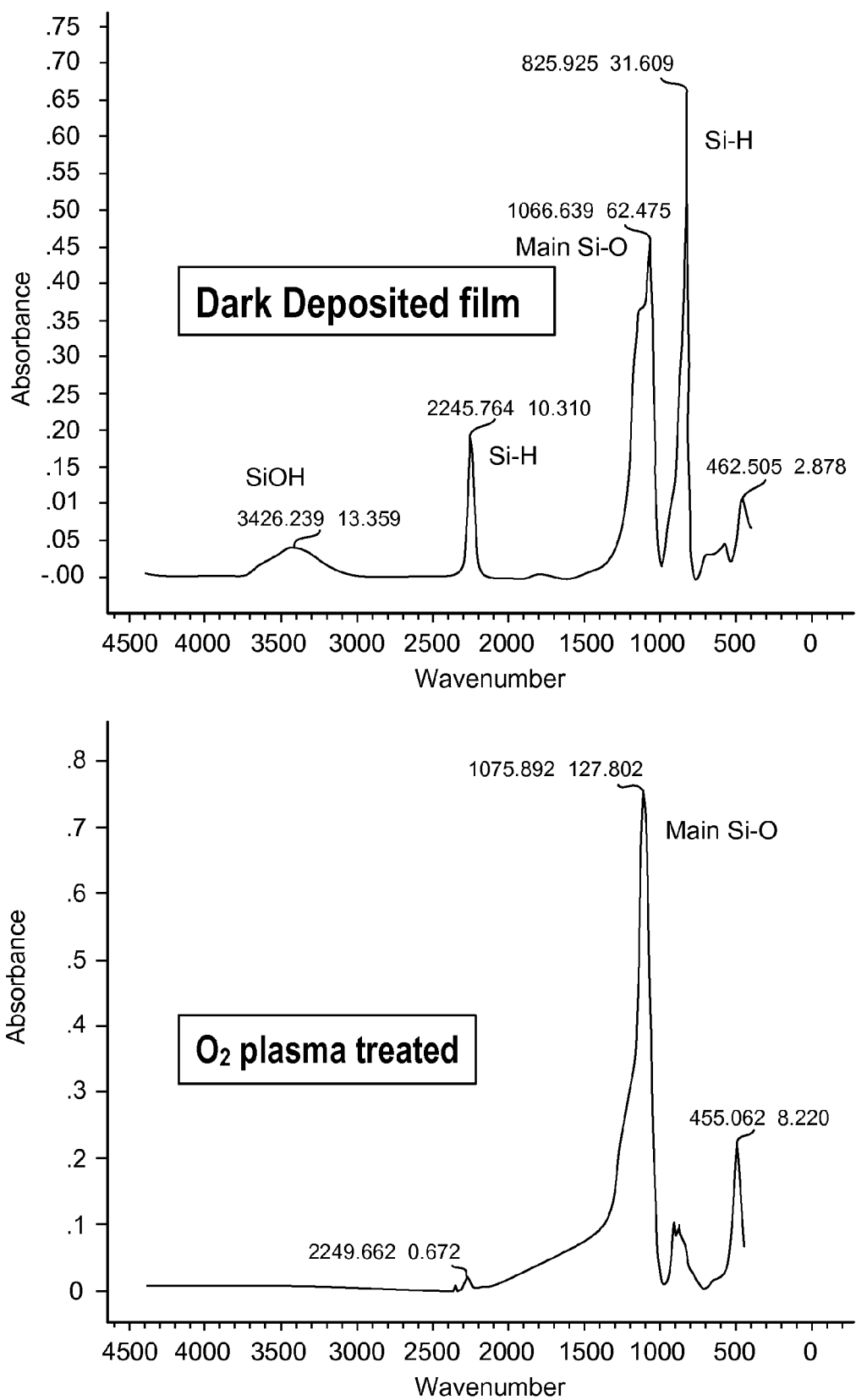
FIG. 12 shows FTIR spectra of a dark-deposited film before and after exposure to an oxygen plasma.

FIG. 12 shows FTIR spectra of the dark deposited flowable film and the plasma treated film. As can be seen from FIG. 12, Si—H, Si—OH and Si—O bonds are present in the dark deposited film. Treatment with an oxygen plasma results in removal of the —OH group, near elimination of the Si—H bonds and a considerable increase in the main Si—O bond.

A similarly deposited film was exposed to helium plasma for 60 seconds. The helium plasma treatment was observed to remove the Si—OH bonds. No changes were observed in the Si—H bonds. A similarly deposited film was exposed to a steam plasma for 180 seconds. The steam plasma treatment was observed to remove the Si—OH bonds and cause a slight decrease in Si—H bonds. A slight increase in Si—O bonds was also observed.

Figure 13:
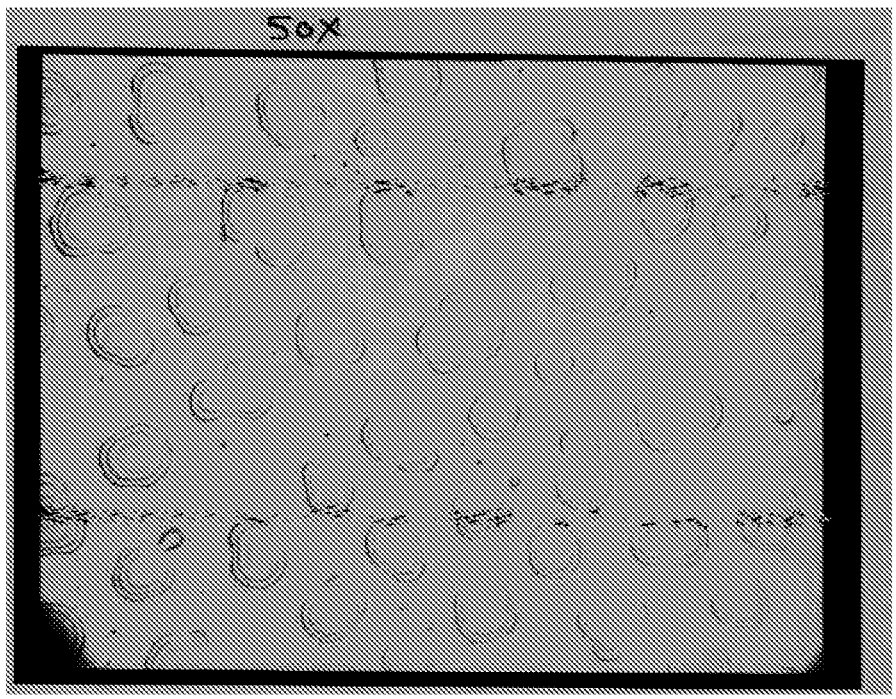
FIG. 13 is a microscope image showing circular growth of the flowable film caused by a completed reaction between the silicon and oxidant precursors.

FIG. 13 shows a microscope image of a film deposited under conditions that allowed the silicon-containing precursor and oxidant reaction to reach completion. As can be seen, the image shows perfect circular growth spots 1301—indicating that the reaction has reached completion.

Figure 14:
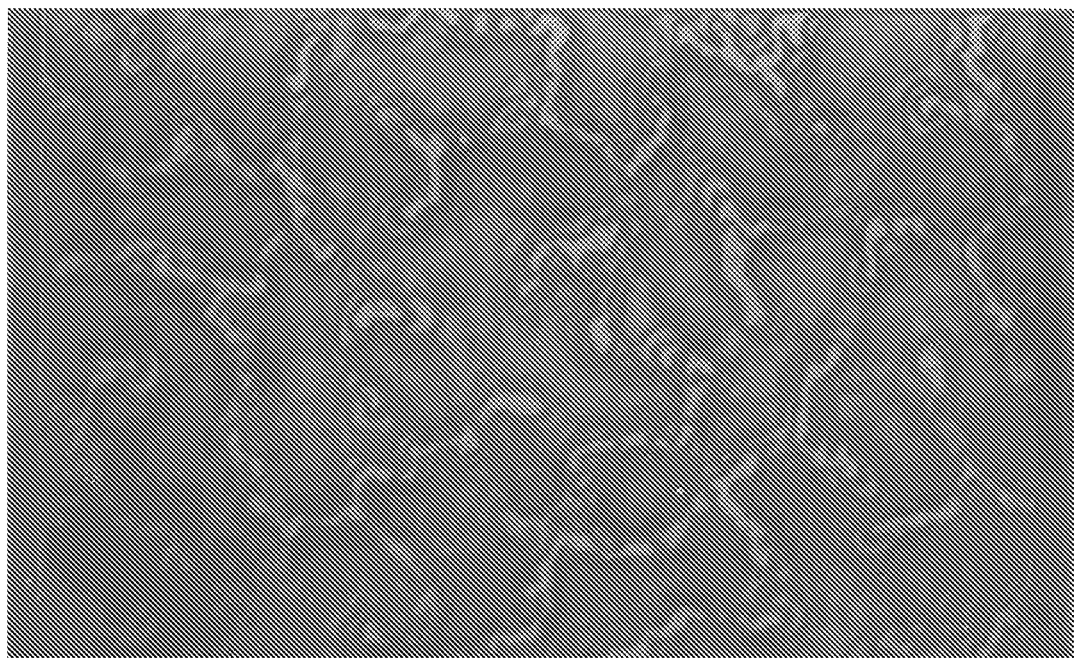
FIG. 14 is a microscope image showing irregular growth of the flowable film caused by incomplete reaction between silicon and oxidant precursors due to the presence of an alcohol inhibitor.

A film was deposited with isopropyl alcohol added to steam oxidant. FIG. 14 shows a microscope image of the resulting film. As can be seen in FIG. 14, the microscope image shows irregular grain boundaries 1401, unlike the circular growth depicted in FIG. 13. Without being bound by a particular theory, it is believed that the ethoxy group remains attached to silicon and aids in networking the film by acting as a link. This indicates that the addition of an alcohol inhibitor to the oxidant precursor aids in reducing the reaction rate. This reduction in reaction rate prevents the reaction from reaching completion, due to incomplete conversion of all ethoxy groups caused by an oxidant deficiency.

Other Embodiments

While this invention has been described in terms of certain embodiments, there are various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:
1. A method comprising:
introducing vapor phase compounds including a dielectric precursor reactant and a catalyst into a reaction chamber; and forming a flowable film on a substrate in the reaction chamber by a catalyzed condensation reaction.

2. The method of claim 1, wherein the dielectric precursor reactant is a silane or a siloxane.

3. The method of claim 1, wherein the dielectric precursor reactant is selected from triethoxysilane (TES), tetraethylorthosilane (TEOS), tetramethoxysilane (TMOS), methyl triethoxysilane (MTEOS), methyltrimethoxysilane (MTMOS), dimethyldimethoxysilane (DMDMOS), trimethylmethoxysilane (TMMOS), dimethyldiethoxysilane (DMDEOS), bis-triethoxysilylethane (BTEOSE) or bis-triethoxysilylmethane (BTEOSM), tetramethylcyclotetrasiloxane (TMCTS), octamethylcyclotetrasiloxane (OMCTS), tetravinyltetramethylcyclotetrasiloxane (TVTMCTS) and mixtures thereof.

4. The method of claim 1, wherein the dielectric precursor reactant is a vapor phase polymeric precursor.

5. The method of claim 1, wherein the catalyst is a base.

6. The method of claim 1, wherein the catalyst is an acid.

7. The method of claim 1, wherein the vapor phase compounds introduced into the reaction chamber further comprise an alcohol.

8. The method of claim 1, wherein the vapor phase compounds introduced into the reaction chamber further comprise a solvent.

9. The method of claim 1, wherein the substrate is not exposed to a plasma during formation of the flowable film on the substrate.

10. The method of claim 1, wherein the flowable film at least partially fills a gap on the substrate.

11. The method of claim 1, further comprising reacting the flowable film with a second reactant.

12. The method of claim 1, further comprising reacting the dielectric precursor reactant with a second reactant to form the flowable film.

13. The method of claim 12, wherein the second reactant and dielectric precursor reactant are introduced to the reaction chamber sequentially.

14. The method of claim 1, further comprising exposing the flowable film to species generated by a plasma source.

15. The method of claim 1, further comprising exposing the flowable film to ultraviolet or microwave radiation.

16. The method of claim 1, wherein the substrate temperature is between about −20° C. and 100° C. during formation of the flowable film.

17. The method of claim 1, further comprising, after forming the flowable film on the substrate, performing a post-deposition operation selected from a thermal anneal, a plasma anneal, a ultraviolet exposure operation, or a microwave exposure operation.

18. The method of claim 17, wherein the post-deposition operation is performed in an oxidizing atmosphere.

19. A method comprising:
introducing process gases including a dielectric precursor reactant, a second reactant, and a catalyst into a reaction chamber; and
reacting the dielectric precursor reactant with the second reactant to form a flowable film on a substrate in the reaction chamber.

20. The method of claim 19, wherein forming the flowable film comprises contacting the substrate with the dielectric precursor reactant in vapor phase to a partial pressure at or below the saturation pressure of the dielectric precursor reactant.

21. The method of claim 19, wherein forming the flowable film comprises contacting the substrate with the dielectric precursor reactant in vapor phase at a partial pressure of at least about the saturation pressure of the precursor reactant and further comprising subsequently reducing the partial pressure of the dielectric precursor reactant to a level below its saturation pressure.

22. The method of claim 19, further comprising exposing the flowable film to ultraviolet or microwave radiation.

23. The method of claim 19, further comprising exposing the flowable film to species generated by a plasma source.

24. The method of claim 23, wherein the plasma source is an inductively-coupled plasma source.

25. The method of claim 19, wherein the flowable film at least partially fills a gap on the substrate.

26. The method of claim 19, further comprising, after forming the flowable film on the substrate, performing a post-deposition operation selected from a thermal anneal, a plasma anneal, a ultraviolet exposure operation, or a microwave exposure operation.

27. The method of claim 26, wherein the post-deposition operation is performed in an oxidizing atmosphere.

* * * * *